United States Patent
Chan et al.

(10) Patent No.: US 9,013,678 B2
(45) Date of Patent: *Apr. 21, 2015

(54) PROJECTION OBJECTIVE HAVING MIRROR ELEMENTS WITH REFLECTIVE COATINGS

(75) Inventors: Danny Chan, Berlin (DE); Hans-Juergen Mann, Oberkochen (DE); Sascha Migura, Aalen-Unterrombach (DE)

(73) Assignee: Carl Zeiss SMT GmbH, Oberkochen (DE)

(*) Notice: Subject to any disclaimer, the term of this patent is extended or adjusted under 35 U.S.C. 154(b) by 323 days.

This patent is subject to a terminal disclaimer.

(21) Appl. No.: 13/613,390

(22) Filed: Sep. 13, 2012

(65) Prior Publication Data

US 2013/0010352 A1  Jan. 10, 2013

Related U.S. Application Data

(63) Continuation of application No. 12/703,417, filed on Feb. 10, 2010, now Pat. No. 8,279,404, which is a continuation of application No. PCT/EP2007/007326, filed on Aug. 20, 2007.

(51) Int. Cl.
*G03B 27/54* (2006.01)
*G03B 27/72* (2006.01)
(Continued)

(52) U.S. Cl.
CPC .............. *G03F 7/70308* (2013.01); *B82Y 10/00* (2013.01); *G02B 5/0891* (2013.01);
(Continued)

(58) Field of Classification Search
CPC ............ G03F 7/70308; G03F 7/70223; G02B 17/0663

USPC .................................. 355/52, 53, 55, 67–71
See application file for complete search history.

(56) References Cited

U.S. PATENT DOCUMENTS

| | | |
|---|---|---|
| 5,153,898 A | 10/1992 | Suzuki et al. |
| 5,911,858 A | 6/1999 | Ruffner |

(Continued)

FOREIGN PATENT DOCUMENTS

| | | |
|---|---|---|
| CN | 1311447 | 9/2001 |
| DE | 10 2006 043 251 | 3/2007 |

(Continued)

OTHER PUBLICATIONS

Japanese Office Action, with English translation, for corresponding JP Appl No. 2010-521307, dated mailed Nov. 1, 2012.

(Continued)

*Primary Examiner* — Hung Henry Nguyen
(74) *Attorney, Agent, or Firm* — Fish & Richardson P.C.

(57) ABSTRACT

An optical system is disclosed that includes a plurality of elements arranged to image radiation at a wavelength λ from an object field in an object surface to an image field in an image surface. The elements include mirror elements have a reflective surface formed by a reflective coating positioned at a path of radiation. At least one of the mirror elements has a rotationally asymmetrical reflective surface deviating from a best-fit rotationally symmetric reflective surface by about λ or more at one or more locations. The elements include an apodization correction element effective to correct a spatial intensity distribution in an exit pupil of the optical system relative to the optical system without the apodization correcting element. The apodization correction element can be effective to increase symmetry of the spatial intensity distribution in the exit pupil relative to the optical system without the apodization correcting element.

27 Claims, 16 Drawing Sheets

(51) Int. Cl.
| | |
|---|---|
| *G03F 7/20* | (2006.01) |
| *B82Y 10/00* | (2011.01) |
| *G02B 5/08* | (2006.01) |
| *G02B 13/14* | (2006.01) |
| *G02B 17/06* | (2006.01) |
| *G21K 1/06* | (2006.01) |

(52) U.S. Cl.
CPC .......... *G02B13/143* (2013.01); *G02B 17/0663* (2013.01); *G03F 7/70233* (2013.01); *G21K 1/062* (2013.01); *G21K 2201/067* (2013.01)

(56) References Cited

U.S. PATENT DOCUMENTS

| | | | |
|---|---|---|---|
| 5,973,826 | A | 10/1999 | Chapman et al. |
| 6,014,252 | A | 1/2000 | Shafer |
| 6,656,575 | B2 * | 12/2003 | Bijkerk et al. ............. 428/212 |
| 6,927,901 | B2 | 8/2005 | Mann et al. |
| 7,224,430 | B2 * | 5/2007 | Dierichs .................... 355/53 |
| 7,414,781 | B2 * | 8/2008 | Mann et al. ................ 359/365 |
| 7,522,335 | B2 | 4/2009 | Lee |
| 7,523,335 | B2 * | 4/2009 | Hamaguchi et al. ......... 713/324 |
| 8,279,404 | B2 * | 10/2012 | Chan et al. ................ 355/67 |
| 8,605,257 | B2 | 12/2013 | Scheible et al. |
| 2002/0022093 | A1 | 2/2002 | Kuntz et al. |
| 2003/0081722 | A1 | 5/2003 | Kandaka et al. |
| 2004/0061930 | A1 | 4/2004 | Wedowski |
| 2004/0189968 | A1 | 9/2004 | Terasawa |
| 2006/0076516 | A1 | 4/2006 | Wedowski |
| 2006/0091324 | A1 | 5/2006 | Dierichs |
| 2007/0058269 | A1 | 3/2007 | Mann et al. |
| 2007/0171558 | A1 | 7/2007 | Mann et al. |
| 2011/0229827 | A1 | 9/2011 | Mann et al. |

FOREIGN PATENT DOCUMENTS

| | | |
|---|---|---|
| EP | 1 434 093 | 6/2004 |
| JP | H 09-326347 | 12/1997 |
| JP | 10-026698 | 1/1998 |
| JP | 2003-177319 | 6/2003 |
| JP | 2004-524524 | 8/2004 |
| JP | 2006-058023 | 3/2006 |
| JP | 2006-059889 | 3/2006 |
| JP | 2006-128697 | 5/2006 |
| JP | 2007-140105 | 6/2007 |
| JP | 2007-515770 | 6/2007 |
| JP | 2009-508150 | 2/2009 |
| WO | WO 2005/119369 | 12/2005 |
| WO | WO 2007/031271 | 3/2007 |

OTHER PUBLICATIONS

Chinese Office Action, with translation thereof, for corresponding CN Appl No. 2012-10116398.6, dated Dec. 23, 2013.

Japanese Office, with translation thereof, for JP Appl. 2013-097906, dated Apr. 2, 2014.

Bal, Matthieu Frédéric, dissertation "Next-Generation Extreme Ultraviolet Lithographic Projection Systems", pp. 1-139, (Feb. 10, 2003).

International Search Report and a Written Opinion from the counterpart PCT Application No. PCT/EP2007/007326, filed Aug. 20, 2007.

Hector, "Pupil Plane Filter for EUV Lithography," Motorola Technical Developments, Motorola Inc., Schamburg, Illinois, vol. 37, Jan. 1, 1999, 26-29.

Danny Chan, U.S. Appl. No. 60/872,503, entitled "Projection objective having mirror elements with reflective coatings," filed Dec. 4, 2006.

* cited by examiner

PROJECTION OBJECTIVE HAVING MIRROR ELEMENTS WITH REFLECTIVE COATINGS

CROSS-REFERENCE TO RELATED APPLICATIONS

This application is a continuation of, and claims priority under 35 U.S.C. §120 to, U.S. patent application Ser. No. 12/703,417, filed Feb. 10, 2010, which, in turn, claims priority under 35 U.S.C. §120 to international application PCT/EP2007/007326, filed Aug. 20, 2007. The contents of U.S. application Ser. No. 12/703,417 and international application PCT/EP2007/007326 are hereby incorporated by reference in their entirety.

FIELD

This disclosure relates to optical systems having mirror elements with reflective coatings for use with short wavelength radiation in photolithography equipment.

BACKGROUND

Optical systems may be employed as projection objectives in projection exposure systems used for fabricating semiconductor devices and other types of microdevices and serve to project patterns on photomasks (or reticles) onto an object having a photosensitive coating at ultrahigh resolution.

In order to allow creating even finer structures, various approaches to improving the resolving power of projection objectives are being pursued. It is well known that resolving power may be improved by increasing the image-side numerical aperture (NA) of the projection objective. Another approach is employing shorter-wavelength electromagnetic radiation.

Deep ultraviolet (DUV) lithography at 193 nm, for example, typically involves a projection system with a numerical aperture of 0.75 or higher to achieve 0.2 μm or smaller features. At this NA, the depth of focus (DOF) is some tenths of a micrometer. In addition, fabrication and assembly tolerances make it difficult to build optical systems with such as large NA.

As is known in the art, short wavelength ultraviolet radiation (less than about 193 nm) is not generally compatible with many refractive lens materials due to the intrinsic bulk absorption. To reduce the radiation absorption within an optical system, reflective elements may be used in place of refractive optical elements. State of the art DUV systems often use catadioptric optical systems which include refractive lenses and reflective elements (mirrors).

Systems that operate at moderate numerical apertures and improve resolving power largely by employing short-wavelength electromagnetic radiation from the extreme-ultraviolet (EUV) spectral region have been developed. In the case of EUV-photolithography employing operating wavelengths of 13.5 nm, resolutions of the order of 0.1 μm at typical depths of focus of the order of 1 μm may theoretically be obtained for numerical apertures of NA=0.1.

It is well known that radiation from the extreme-ultraviolet spectral region cannot usually be focused using refractive optical elements, since radiation at the short wavelengths involved is usually absorbed by the known optical materials that are transparent at longer wavelengths. Pure mirror system (catoptric optical systems) that have several concavely and/or convexly curved mirrors that have reflective coatings are thus employed in EUV-photolithography. The reflective coatings employed are typically multilayer coatings having, for example, alternating lay-ers (films) of molybdenum and silicon.

In the manufacture of semiconductor components and other finely structured components, a pattern from a mask to be imaged on a substrate is usually formed by lines and other structural units representing a specific layer of the component to be produced. The structures to be produced for semiconductor components typically include tiny metallic tracks and silicon tracks as well as other structural elements, which may be characterized by critical dimensions (CD) which, in the case of EUV-photolithography may be in the order of 100 nm or below. Where the pattern of a mask has structural features with given critical dimension on different parts of the mask, it is desired to reproduce the relative dimensions as precisely as possible in the structured substrate. However, various influences involved in the lithography process may result in undesirable variations of the critical dimensions (CD variations) in the structured substrate, which may affect the performance of the structured components negatively. Therefore, it is generally desired to improve lithography equipment and processes to minimize CD variations, especially lateral variations across the exposed field.

In many applications, linear features of the pattern run in different directions. It has been observed that under certain conditions a contrast obtained in a lithographic process depends on the structural orientation, thereby leading to what is commonly denoted as horizontal-vertical differences (H-V differences), which may affect the performance of the structured components negatively. Therefore, it may be desired to improve lithographic equipment and processes to minimize H-V differences.

Photolithographic equipment, or steppers, employ two different methods for projecting a mask onto a substrate, namely, the "step-and-repeat" method and the "step-and-scan" method. In the case of the "step-and-repeat" method, large areas of the substrate are exposed in turn, using the entire pattern present on the reticle. The associated projection optics thus have an image field that is large enough to allow imaging the entire mask onto the substrate. The substrate is translated after each exposure and the exposure procedure repeated. In the case of the step-and-scan method that is preferred here, the pattern on the mask is scanned onto the substrate through a movable slit, where the mask and slit are synchronously translated in parallel directions at rates whose ratio equals the projection objectives magnification.

SUMMARY

In some embodiments, the disclosure provides an EUV projection optical system operable at high numerical aperture capable of imaging patterns with a low level of variation of critical dimensions.

In certain embodiments, the disclosure provides an EUV projection optical system operable at high numerical aperture capable of imaging patterns with little or low orientation dependence of contrast.

In some embodiments, the disclosure provides an EUV projection optical system operable at high numerical aperture having a low level of image-side telecentricity error.

In some embodiments, the disclosure provides an optical system that includes: a plurality of elements arranged to image radiation at a wavelength λ from an object field in an object surface to an image field in an image surface; the elements including mirror elements having a reflective surface formed by a reflective coating positioned at a path of radiation; at least one of the mirror elements having a rotationally asymmetrical reflective surface deviating from a best-fit rotationally symmetric reflective surface by about λ or more at one or more locations; the elements including an apodization correction element effective to correct a spatial intensity distribution in an exit pupil of the optical system relative to the optical system without the apodization correcting element.

An optical system according to preceding paragraph includes at least one mirror element having a rotationally asymmetrically reflective surface deviating from the best-fit rotationally symmetric surface by about λ or more at one or more locations. Reflective elements having reflective surfaces according to this condition will be denoted "freeform surfaces" in this application. Utilizing at least one freeform surface in the optical system provides additional free parameters to optimize the optical system with regard to overall transmission, uniformity of field illumination, and other quality parameters. Further, freeform surfaces may be shaped and positioned such that only relatively small local angles of incidence, Θ, and/or relatively small ranges of angles of incidence, ΔΘ, of rays and/or relatively small average angles of incidence, $Θ_{avg}$ on each reflective surface for a selected reflection of the optical system are obtained, thereby reducing problems typically associated with higher incidence angles.

Unlike spherical or aspherical mirrors, freeform mirror surfaces do not have an axis of rotational symmetry. Generally, a freeform surface deviates from a best fit rotationally symmetric surface (e.g., a spherical or aspherical surface). A freeform surface can, for example, have a maximum deviation from a best fit sphere of about λ or more. Definitions and descriptions of freeform surfaces and their use in optical systems for EUV lithography and other applications may be taken from applicant's US-patent application US 2007/0058269 A1. The disclosure of that patent application is incorporated herein by reference.

While utilizing one or more freeform surfaces may be advantageous with respect to overall transmission, for example, it has been found that significant field dependent apodization effects may be caused by freeform surfaces due to the lack of rotational symmetry. In the context of this application, the term "apodization" is intended to characterize effects resulting from the fact that different rays originating from one and the same field point in the object surface may be characterized by different values of the overall transmission which characterizes the loss of radiant energy of the ray upon propagation between the object surface and the image surface. As different rays emanating from an object field point in different directions are typically incident at different positions and/or at different angles of incidence on various mirrors within the optical system, and each of the mirrors typically has different reflectivities for rays incident on different locations of the mirror and/or at different angles of incidence, a significant variation of transmission for each of the rays may occur. As seen from a selected image field point (field point in the image field) the apodization may be characterized by a given spatial intensity distribution in the exit pupil of the optical system. For example, in the absence of apodization, the spatial intensity distribution in the exit pupil may be uniform for selected field point. However, in general, there is an uneven distribution of intensity in the exit pupil for each of the field points. Further, in general, the spatial intensity distribution in the exit pupil varies for each of the image filed points such that each of the image field points "sees" a different spatial intensity distribution in the exit pupil. This effect is denoted as "field depend-ent apodization" in this application. It has been found that field dependent apodization may contribute to undesirable CD variations.

According to the above aspect of the disclosure an apodization correction element is provided which may be specifically designed to decrease the field dependence of the spatial intensity distribution in the exit pupil when compared to the same optical system without the apodization correcting element. As a result, an improved optical performance of the optical system, e.g. with regard to generation of CD variations and other effects originating from field dependent apodization, may be obtained.

The apodization correcting element may be designed to be effective to increase symmetry of the spatial intensity distribution in the exit pupil of the optical system as compared to the same optical system without the apodization correcting element.

In some embodiments, the apodization correcting element may be designed to be effective to improve rotational symmetry of the intensity distribution in the exit pupil as compared to the same optical system without the apodization correcting element. In general, a variation of structural contrast with structure orientation may be avoided where the intensity distribution in the exit pupil is rotationally symmetric to the center of the exit pupil. On the other hand, significant deviations of the intensity distribution from rotational symmetry may cause or contribute to a significant dependence of structural contrast from structure orientation, usually denoted as horizontal-vertical differences (H-V difference).

While spatial positions at or close to a center of the exit pupil correspond to low aperture rays, those rays corresponding to the largest aperture angles in the image space correspond to locations at or close to the outer edge of the exit pupil. Those rays are critical with respect to the resolution obtained at given image-side numerical aperture. It may be useful to define the rotational symmetry of the intensity distribution in the exit pupil, or a deviation therefrom, specifically with regard to rays originating from an edge region at or close to the outer edge of the pupil surface. In some embodiments, the spatial intensity distribution in the exit pupil is characterized by an apodization parameter APO representing a normalized azimuthal variation of the intensity in an edge region of the exit pupil according to:

$$APO=(I_{MAX}-I_{MIN})/(I_{MAX}+I_{MIN}),$$

wherein $I_{MAX}$ is the maximum value of the intensity in the edge region of the exit pupil and $I_{MIN}$ is the minimum value of the intensity in the edge region of the exit pupil, which is typically found at another azimuthal (circumferential) position than the maximum intensity value. It is evident that this apodization parameter equals zero for a completely rotationally symmetric intensity distribution in the outer edge region of the exit pupil and becomes larger the larger the deviation from rotational symmetry becomes. In exemplary embodiments, the apodization correcting element is effective to decrease the normalized azimuthal variation of the intensity of the edge region of the exit pupil when compared to an optical system without the apodization correcting element. For example, the apodization parameter APO defined above may be decreased by at least 1% or more, such as at least 5% or more.

In some embodiment the apodization correcting element may be designed to be effective to shift an intensity centroid of the intensity distribution in the exit pupil towards a center of the exit pupil when compared to the same optical system without the apodization correcting element. Where the centroid of the intensity distribution in the exit pupil is situated significantly outside the center of the exit pupil a telecentricity error may occur. A telecentricity error, in turn, may cause a shift of the image position with defocus, which is generally not desirable. Problems associated with image-side telecentricity error may be avoided or minimized where the centroid of the intensity distribution in the exit pupil is at or close to the center of the exit pupil.

In some embodiments, the apodization correcting element may be designed to be effective to increase mirror symmetry of the intensity distribution in the exit pupil relative to a meridional plane when compared to the same optical system without the apodization correcting element.

In some embodiments, the apodization correcting element may be designed to be effective to reduce the field-dependent apodization when compared to the same optical system without the apodization correcting element. In general, where a pupil apodization is essentially the same for all field points (field-constant pupil apodization) corresponding aberrations, such as telecentricity error and orientation-dependent contrast, will be essentially the same for all field points. In those cases, a compensation of those aberrations may be compensated for by modifications in the optical system. For example, where a telecentricity error is essentially the same for all field points, such error may be compensated for by tilting the illumination radiation incident on the object field. On the other hand, where the apodization varies significantly across the field, a significant amount of CD variations may be effected, which may be difficult to compensate for.

It has been found that in some embodiments an improvement with respect to mirror symmetry and/or with respect to the position of the intensity centroid may be obtained concurrently with improving the rotational symmetry of the intensity distribution in the exit pupil.

The apodization correcting element may be a filter element provided in addition to mirror elements and having a spatially varying distribution of transmission across the utilized area of the filter element. The filter element may include at least one layer of an absorbing material having significant absorption at the operating wavelength λ. The layer may have a geometrical thickness varying across a utilized area such that a spatial variation of transmission and/or reflectance is obtained.

In some embodiments, the apodization correcting element is a mirror element having a reflective surface formed by a reflective coating designed as a non-rotationally symmetric, graded coating including a multilayer stack of different materials, at least one of the layers having a geometrical layer thickness which varies according to a first grading function in a first direction of the coating and according to a second grading function, different from the first grading function, in a second direction perpendicular to the first direction.

A non-rotationally symmetric, graded reflective coating providing a rotationally asymmetrical reflectance across the reflective surface will also be denoted as "freeform coating" in this application.

In some embodiments, the apodization correcting element is a mirror element having a reflective surface formed by a reflective coating including a multilayer stack of different materials, the layers including a cap layer on a radiation entry side facing away from a mirror substrate, wherein the cap layer has a geometrical layer thickness which varies according to a rotationally asymmetrical grading function across the reflective surface.

In general, multilayer systems such as those used as mirrors in the extreme ultraviolet wavelength range may suffer contamination or oxidation during storage in air and in long-time operation. It is known to provide such multilayer systems with protective layers on the radiation entry side thereof to improve lifetime and constancy of reflectivity of those multilayer systems. The term "cap layer" as used here may refer to such protective layer or layers. A cap layer may be made from ruthenium, aluminium oxide, silicon carbide, molybdenum carbide, carbon, titanium nitride or titanium dioxide, for example. Alternatively, a mixture, an alloy or a compound of ruthenium, aluminium oxide, titanium nitride or titanium dioxide, and a further substance may be used to form the cap layer. Examples of multilayer systems with protective cap layers and production methods thereof are disclosed in U.S. Pat. No. 6,656,575 B2, which is incorporated herein by reference.

For example, the geometrical layer thickness of the cap layer may vary according to a first grading function in a first direction of the coating and according to the second grading function, different from the first grading function, in a second direction perpendicular to the first direction.

In some embodiments, the geometrical thickness of the cap layer increases from an origin in a center region of the cap layer towards the edge of the mirror slightly in the first direction and an amount of increase between the origin and the edge region is significantly larger in the second direction. Considering the intensity filtering effect of the material of the cap layer a strong absorbing effect may be obtained near the outer edge in the second direction and significantly less absorption may be effected the outer edge in the first direction.

In some embodiments, the layer thickness of the cap layer is essentially uniform in central zone around the origin at least up to radial coordinates corresponding to an outer edge of a region corresponding to a first sub-aperture corresponding to a central field point and the layer thickness of the cap layer increases outside the central region slightly in the first direction and stronger in the second direction. If the spatial distribution of the layer thickness of the cap layer is designed generally in accordance with this teaching the apodization correcting element has little or no apodization changing effect on rays originating from the center of the object field, whereas the apodization may be changed in the targeted manner for rays originating from regions close to or at the edge of the object field, whereby a field dependence of apodization may be decreased.

In some embodiments, the reflective coating includes a plurality of intermediate layers arranged between the cap layer and the mirror substrate, wherein each of the plurality of intermediate layers has a uniform layer thickness. The intermediate layers may include a Molybdenum-Silicon bilayer stack, for example.

Where only the geometrical thickness of the cap layer is varied, substantially no additional interference effects occur which might be introduced if the geometrical thicknesses of other layers of the multilayer stack would be varied spatially. Therefore, a correction of phase to account for the variation of geometrical thickness of the cap layer may be relatively simple.

In some embodiments, the material of the cap layer has significant absorbance for the radiation at wavelength λ and a corresponding refractive index which is at or close to 1 for the used wavelength. Under these conditions the cap layer has little or almost no influence on the phase of the reflected radiation, whereby correaction of imaging errors is facilitated.

In some embodiments, the material of the cap layer has an absorbance for the radiation at wavelength λ which is greater than a specific absorbance of each of the materials of the intermediate layers. The absorbance of the material of the cap layer may be greater than the absorbance of Silicon and/or greater than the absorbance of Molybdenum. An absorbance difference may be 10% or more (or 20% or more, or 30% or more, or 50% or more) for example.

In some embodiments, the apodization correcting element has a reflective surface formed by a reflective coating including a multilayer stack of layers of different materials, the layers forming a stack of bilayers, wherein a bilayer includes a (relatively thick) layer of a first material, e.g. Si, having a first refractive index and a (relatively thin) second layer of a second material, e.g. Mo, having a second refractive index which is lower than the first refractive index, wherein a thickness ratio between a geometrical thickness of the first layer and the second layer of at least one bilayer varies according to first grading function in a first direction of the coating and according to a second grading function, different from the first grading function, in a second direction perpendicular to the first direction.

In some embodiments, the apodization correcting element includes at least one filter layer disposed on the cap layer on a radiation entry side thereof, wherein the filter layer is made from a filter layer material absorbing for radiation at wavelength $\lambda$ and having a geometrical thickness which varies spatially. The layer system below the filter layer and including the cap layer may be formed in a conventional process and the filter layer may be added in a separate manufacturing step based on data evaluated for the optical design without filter layer. Process reliability may thereby be maintained.

The filter layer material may have a greater specific absorbance at wavelength $\lambda$ than the material of the cap layer. In this case, a smaller variation of geometrical thickness of the filter layer may be sufficient to obtain the same degree of variation of reflectance of the apodization correcting element.

Alternatively, the filter layer material may have a smaller specific absorbance at wavelength $\lambda$ than the material of the cap layer. In this case, the absolute layer thickness of the filter layer may be relatively thick and a desired variation of the overall absorbing effect across the filter layer may be achieved with high accuracy through appropriate variation of geometrical layer thickness of the filter layer. Where a relatively thick filter layer is used, it is desirable to use a material having a refractive index at or close to 1 to avoid negative effects of the filter layer on the phase of the reflected radiation.

Alternatively, the filter layer material may have essentially the same specific absorbance at wavelength $\lambda$ than the material of the cap layer. The filter layer may be made from the cap layer material, thereby allowing to form a cap layer with spatially varying geometrical layer thickness.

The filter layer may be made from ruthenium, aluminium oxide, silicon carbide, molybdenum carbide, carbon, titanium nitride or titanium dioxide or the filter layer material may be a mixture, an alloy or a compound of ruthenium, aluminium oxide, titanium nitride or titanium dioxide, and a further substance.

An apodization correcting element may be positioned at various positions along the radiation beam path between object surface and image surface.

In some embodiments, the apodization correcting element is positioned optically remote from a pupil surface of the optical system. Where the apodization element is placed at a position sufficiently remote from a pupil surface it is generally possible to influence different field points differently from each other such that a field-dependent variation of apodization may be corrected or reduced. The apodization correcting element may be positioned at a position where condition P(M) <1 is fulfilled, wherein $$P(M)=D(SA)/(D(SA)+D(CR)),$$

where $D(SA)$ is a diameter of a sub-aperture of a ray bundle originating from a field point in the object surface on a respective surface M; and $D(CR)$ is a maximum distance of chief rays of an effective object field imaged by the optical system measured in a reference plane of the optical system on the surface M. The reference plane may be a symmetry plane of the optical system. In systems having a meridional plane, the reference plane may be the meridional plane. As the diameter of a sub-aperture approaches zero at a field surface, the parameter $P(M)=0$ in a field surface. In contrast, the maximum distance of chief rays, $D(CR)$, approaches zero in pupil surface. Therefore, the condition $P(M)=1$ is fulfilled for a position exactly in the pupil surface. In some embodiments, the condition $P(M)<0.99$ holds for a position optically remote from a pupil surface.

In some embodiments, the apodization correcting element is positioned in an intermediate region optically between a pupil surface and a field surface of the optical system. In those embodiments, the apodization correcting element is placed neither exactly at a pupil surface nor exactly at a field surface, such as an intermediate image, for example, but at a position sufficiently remote from both a pupil surface and a field surface if it is desired to influence the field dependent variation of apodization. An apodization correcting element placed exactly at a pupil surface cannot influence different field points differently from each other. On the other hand, if an apodization correcting element would be placed at or very close to a field surface, the spatial distribution of intensity within the pupil surface cannot be influenced significantly.

In some embodiments, the apodization correcting element is positioned at a position where condition $0.99>P(M)>0.95$ is fulfilled. Under this condition, the apodization correcting element is neither very close to a pupil surface nor very close to a field surface. Therefore, the sub-apertures of ray bundles originating from different field points do not overlap completely at the position of the apodization correcting element, thereby enabling the apodization correcting element to influence apodization differently for different field points. Further, the apodization correcting element is sufficiently remote from a field surface such that a change in reflectivity at a certain location on the apodization correcting element will have different influence on different locations of the exit pupil, whereby it is possible to vary the spatial intensity distribution in the exit pupil.

In general, an appropriate position of the apodization correcting element may be selected depending on whether or not a field dependence of pupil apodization is significant or not or whether or not a certain degree of field dependence of pupil apodization may be acceptable.

In some embodiments, an apodization correcting element is positioned optically near to a field surface, such as the object surface, or the image surface, or an optional intermediate image surface, for example where $0<P(M)\leq 0.93$. Where an apodization correcting element is positioned at or optically close to a field surface, it is possible to correct variations of critical dimensions (CD variations) across the field and/or to improve field uniformity, i.e. to obtain a more uniform intensity distribution in the image field.

For example, where there is little or substantially no field dependence of pupil apodization, the apodization correcting element may be positioned at or optically close to a pupil surface of the optical system, for example where $0.98<P(M)\leq 1$. Where an apodization correcting element is positioned at or very close to the pupil surface, it is possible to correct field-constant contributions to telecentricity error and/or structure orientation-dependent contrast variations (H-V differences).

The previous and other properties can be seen not only in the claims but also in the description and the drawings, wherein individual characteristics may be used either alone or in sub-combinations as an exemplary embodiment of the disclosure and in other areas and may individually represent advantageous and patentable embodiments.

DETAILED DESCRIPTION

Specific aspect of exemplary embodiments of the disclosure are now described in more detail using as examples catoptric projection objectives which can be used in microlithography tools, e.g. in a projection exposure apparatus for manufacturing semiconductor devices.

Figure 1:
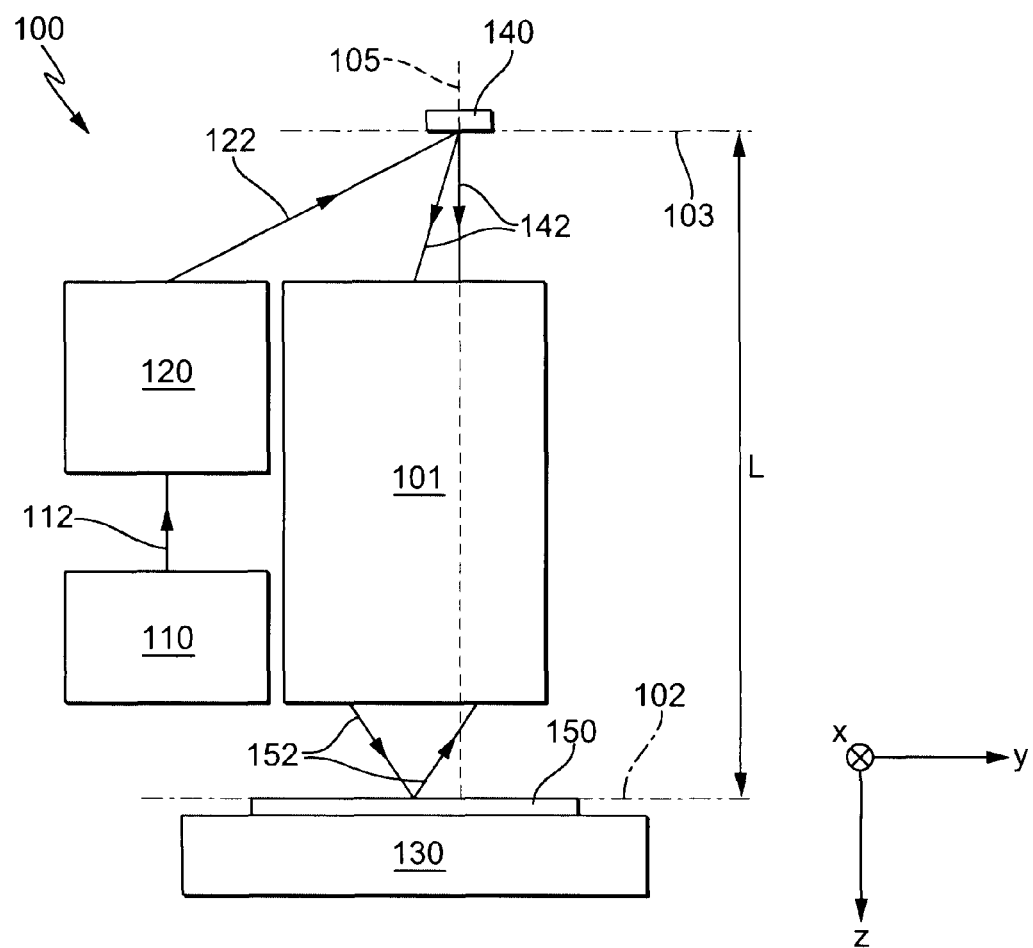
FIG. 1 is a schematic view of an exemplary embodiment of a microlithography tool.

Referring to FIG. 1, a microlithography tool 100 generally includes a light source 110, an illumination system 120, a projection objective 101, and a stage 130. A Cartesian coordinate system is shown for reference. Light source 110 produces radiation at a wavelength λ and directs a beam 112 of the radiation to illumination system 120. Illumination system 120 interacts with (e.g., expands and homogenizes) the radiation and directs a beam 122 of the radiation to a reticle 140 positioned at an object plane 103. Projection objective 101 images radiation 142 reflected from reticle 140 onto a surface of a substrate 150 positioned at an image plane 102. The radiation on the image-side of projection objective 101 is depicted as rays 152. As shown in FIG. 1, the rays are illustrative only and not intended to be accurately depict the path of the radiation with respect to reticle 140, for example. Substrate 150 is supported by stage 130, which moves substrate 150 relative to projection objective 101 so that projection objective 101 images reticle 140 to different portions of substrate 150.

Projection objective 101 includes a reference axis 105. In embodiments where projection objective is symmetric with respect to a meridional section, reference axis 105 is perpendicular to object plane 103 and lies inside the meridional section.

Light source 110 is selected to provide radiation at a desired operational wavelength, λ, of tool 100. Typically, for projection objectives designed for operation in lithography tools, wavelength λ is in the ultraviolet portion, the deep ultraviolet portion or the extreme ultraviolet portion of the electromagnetic spectrum. For example, λ can be about 200 nm or less. λ can be more than about 2 nm. In the exemplary embodiment, light source 110 is an EUV light source providing radiation at an operational wavelength about λ=13.5 nm.

Illumination system 120 includes optical components arranged to form a collimated radiation beam with a homogeneous intensity profile. Illumination system 120 typically also includes beam steering optics to direct beam 122 to reticle 140. In some embodiments, illumination system 120 also includes components to pro-vide a desired polarization profile for the radiation beam.

Image plane 103 is separated from object plane 102 by a distance L, which is also referred to as the lengthwise dimension, or track length, of projection objective 101. In general, this distance depends on the specific design of projection objective 101 and the wavelength of operation of tool 100. In some embodiments, such as in tools designed for EUV lithography, L is in a range from about 1 m to about 3 m.

Figure 2:
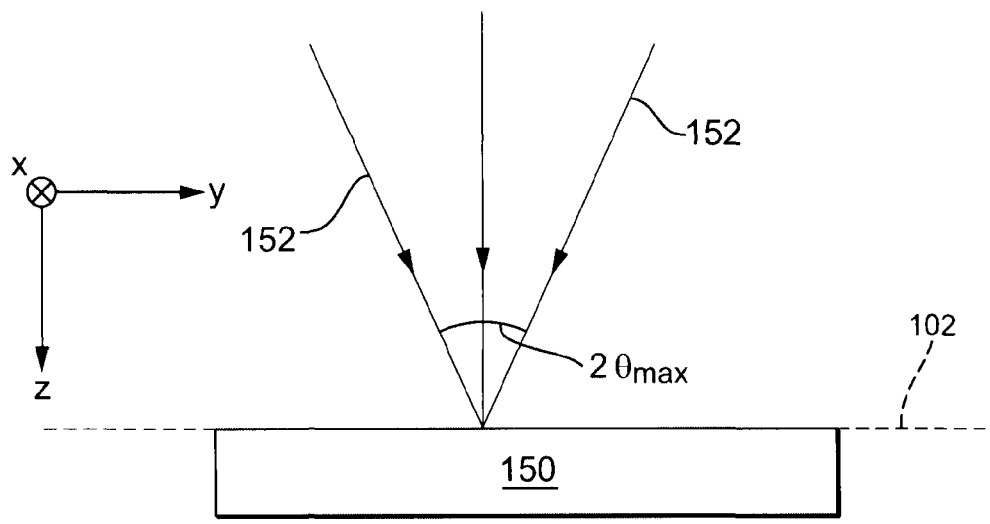
FIG. 2 is a schematic view showing a portion of the microlithography tool shown in FIG. 1.

As shown in FIG. 2, rays 152 define a cone of light paths that form the reticle image at image plane 102. The angle of the cone of rays is related to the image-side numerical aperture (NA) of projection objective 101. Image-side NA can be expressed as $NA = n_o \sin \theta_{max}$, where $n_o$ refers to the refractive index of the medium adjacent the surface of substrate 150 (e.g., air, nitrogen, water or other immersion liquid, or evacuated environment), and $\theta_{max}$ is the half-angle of the maximum cone of image forming rays from projection objective 101.

In general, projection objective 101 can have an image side NA of about 0.1 or more, e.g., about 0.15 or more, about 0.2 or more, about 0.25 or more, about 0.3 or more, about 0.35 or more. In general, problems associated with pupil apodization may be more difficult to compensate the larger the image-side numerical aperture becomes.

The number of mirrors in projection objective 101 may vary. Typically, the number of mirrors is related to various performance trade-offs associated with the optical performance characteristics of the objective, such as the desired throughput (e.g., the intensity of radiation from the object that forms the image at image plane 102), the desired image-side NA and related image resolution, and the desired maximum pupil obscuration (only in systems with pupil obscuration).

Embodiments for EUV applications typically have at least three or at least four mirrors. Exactly six mirrors may be desirable in some cases. Typically no more than six or no more than seven or no more than eight mirrors are used. In embodiments where it is desirable that all the mirrors of the objective are positioned between the object plane and the image plane, objective 101 will typically have an even number of mirrors. In certain embodiments, an odd number of mirrors can be used where all the mirrors of the projection objective are positioned between the object plane and image plane. For example, where one or more mirrors are tilted at relatively large angles, a projection objective can include an odd number of mirrors where all the mirrors are positioned between the object plane and image plane.

At least one of the mirrors in projection objective 101 has a freeform surface. Unlike spherical or aspherical mirrors, freeform mirror surfaces do not have an axis of rotational symmetry. Generally, a freeform surface deviates from a best fit rotationally symmetric surface (e.g., a spherical or aspherical surface). Best fit surfaces are calculated by first calculating the surface area of the mirror surface and then determining a best fit to that surface of a spherical or aspherical surface using a least squares fitting algorithm. The best fit spherical or aspherical surface can be titled or decentered with respect to a reference axis, where decenter and tilt are used as additional fitting parameters. A freeform surface can, for example, have a maximum deviation from a best fit sphere of about $\lambda$ or more. A more general description of freeform surfaces and characterizing features thereof may be taken from applicant's US-application published as US 2007/0058269 A1, which is incorporated herein by reference.

In certain embodiments, freeform mirror surfaces can be described mathematically by the equation:

$$Z = \frac{cr^2}{1 + \sqrt{1 - (1+k)c^2r^2}} + \sum_{j=2}^{\alpha} C_j X^m Y^n \quad (1)$$

where $$j = \frac{(m+n)^2 + m + 3n}{2} + 1 \quad (2)$$

and Z is the sag of the surface parallel to a Z-axis (which may or may not be parallel to the z-axis in projection objective 101), c is a constant corresponding to the vertex curvature, k is a conic constant, and Cj is the coefficient of the monomial $X^m$. Parameter $\alpha$ is an integer indicating the order of the terms considered in the summation. A value $\alpha=66$, for example, corresponds to a sum including the $10^{th}$ order. Typically, the values of c, k, and $C_j$ are determined based on the desired optical properties of the mirror with respect to projection objective 101. Further, the order of the monomial, m+n, can vary as desired. Generally, a higher order monomial can provide a projection objective design with a higher level of aberration correction, however, higher order monomials are typically more computationally expensive to determine. In some embodiments, m+n is 10 or more (e.g., 15 or more, 20 or more). The parameters for the freeform mirror equation can be determined using commercially-available optical design software. In some embodiments, m+n is less than 10 (e.g., 9 or less, 8 or less, 7 or less, 6 or less, 5 or less, 4 or less, 3 or less).

Figure 3:
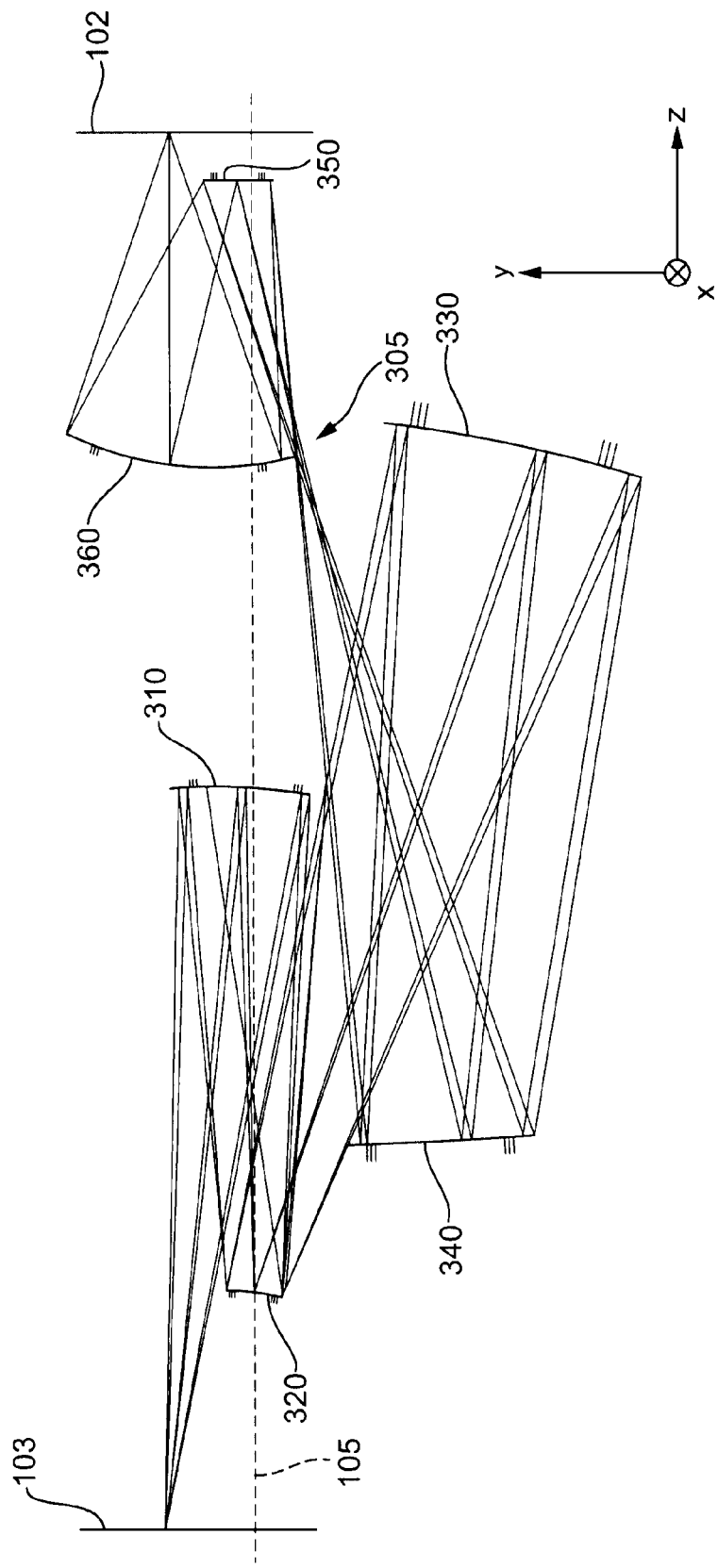
FIG. 3 is a cross-sectional view of a first exemplary embodiment of a projection objective shown in meridional section.

A reference projection objective that includes six mirrors is shown in FIG. 3. Specifically, projection objective 300 includes six freeform mirrors 310, 320, 330, 340, 350, and 360. Data for projection objective 300 is presented in Table 3 and 3A. Table 3 presents optical data, while Table 3A presents freeform constants for each of the mirror surfaces. For the purposes of Table 3 and Table 3A, the mirror designations correlate as follows: mirror 1 (M1) corresponds to mirror 310; mirror 2 (M2) corresponds to mirror 320; mirror 3 (M3) corresponds to mirror 330; mirror 4 (M4) corresponds to mirror 340; mirror 5 (M5) corresponds to mirror 350; and mirror 6 (M6) corresponds to mirror 360. "Thickness" in Table 3 and subsequent tables refers to the distance between adjacent elements in the radiation path. The monomial coefficients, Cj, for the freeform mirrors, along with the amount the mirror is decentered and rotated from an initial projection objective design, are provided in Table 3A. R, the radius, is the inverse of the vertex curvature, c. Decenter is given in mm and rotation is given in degrees. Units for the monomial coefficients are $mm^{-j+1}$. Nradius is a dimensionless scaling factor (see, for example, the manual for CODE V® by Optical Research Associates).

TABLE 3, 3A

| Surface | Radius | Thickness | Mode |
|---|---|---|---|
| Object | INFINITY | 780.487 | |
| Mirror 1 | −651.370 | −538.725 | REFL |
| Mirror 2 | −458.973 | 954.889 | REFL |
| Mirror 3 | −1713.884 | −788.833 | REFL |
| Mirror 4 | 1822.447 | 1037.281 | REFL |
| Mirror 5 | 309.686 | −306.280 | REFL |
| Mirror 6 | 406.556 | 351.325 | REFL |
| Image | INFINITY | 0.000 | |

| Coefficient | M1 | M2 | M3 | M4 | M5 | M6 |
|---|---|---|---|---|---|---|
| K | −5.903672E−01 | 2.073876E+00 | −1.833015E+00 | 3.271462E+00 | 1.890760E+00 | 2.288136E−01 |
| Y | 0.000000E+00 | 0.000000E+00 | 0.000000E+00 | 0.000000E+00 | 0.000000E+00 | 0.000000E+00 |
| X2 | 2.472443E−04 | 6.412975E−04 | 7.597407E−05 | 2.796077E−05 | −5.194312E−04 | 1.242933E−05 |
| Y2 | 1.860007E−04 | 6.109309E−05 | −2.585312E−05 | −7.188311E−05 | −3.216223E−04 | 5.312795E−05 |
| X2Y | −3.583286E−08 | −3.071465E−06 | 1.092569E−07 | 1.012955E−07 | 3.020360E−06 | −2.535119E−08 |
| Y3 | −8.844243E−09 | −3.552973E−06 | −7.253427E−08 | −3.594092E−08 | 1.841453E−06 | −5.500854E−09 |
| X4 | 1.244536E−11 | 8.137457E−10 | −3.305282E−11 | −9.180029E−11 | −3.120770E−10 | −1.505816E−10 |
| X2Y2 | 4.205964E−11 | 4.214802E−09 | −2.413146E−11 | −7.897645E−11 | 1.723114E−08 | −7.741421E−11 |
| Y4 | 7.880677E−11 | −2.267546E−08 | −1.619900E−10 | −1.828672E−10 | −1.496597E−09 | −6.454720E−11 |

TABLE 3, 3A-continued

| | | | | | | |
|---|---|---|---|---|---|---|
| X4Y | −3.805662E−14 | −6.346439E−12 | −1.583112E−14 | 2.866668E−14 | 5.008931E−11 | −1.742178E−14 |
| X2Y3 | −2.029523E−13 | −2.541614E−10 | −1.674478E−13 | 2.799446E−13 | 2.596617E−10 | 4.271686E−15 |
| Y5 | 1.220704E−13 | 1.665324E−10 | −7.087076E−14 | 1.191804E−13 | 3.460656E−11 | 1.015356E−13 |
| X6 | −3.312394E−17 | 2.434475E−14 | 5.577328E−17 | −1.391408E−16 | 6.717835E−14 | −9.513669E−16 |
| X4Y2 | 4.241990E−17 | −5.674715E−13 | −1.846910E−16 | −4.213298E−16 | 3.645922E−13 | −1.757315E−15 |
| X2Y4 | 7.289250E−16 | 1.445006E−12 | −4.864362E−16 | 4.229043E−16 | 1.948906E−12 | −1.108117E−15 |
| Y6 | −1.932461E−15 | −5.889233E−13 | 2.208996E−19 | 3.372721E−16 | −2.972937E−13 | −5.629275E−16 |
| X6Y | 1.312317E−19 | −5.559829E−16 | 4.394337E−19 | −2.093226E−18 | 2.264426E−15 | 7.984310E−20 |
| X4Y3 | −7.425365E−19 | 3.498226E−15 | −3.102058E−19 | −2.302217E−18 | 6.866200E−15 | 3.285060E−19 |
| X2Y5 | −3.017211E−18 | −9.750526E−15 | −5.272924E−19 | 1.016950E−18 | 1.910446E−14 | 8.639175E−19 |
| Y7 | 7.041988E−18 | −1.193805E−15 | −1.040456E−20 | 1.216081E−19 | −3.171040E−15 | 1.122386E−18 |
| X8 | −1.167281E−22 | −2.037245E−19 | −2.161469E−21 | −3.119267E−21 | 1.712789E−18 | −5.553581E−21 |
| X6Y2 | −2.908994E−21 | −8.287593E−18 | 8.189808E−22 | −1.751502E−20 | 1.493607E−17 | −1.603818E−20 |
| X4Y4 | 4.197769E−22 | −5.375652E−17 | −1.274499E−22 | −1.018042E−20 | 4.780170E−17 | −1.716956E−20 |
| X2Y6 | 4.927775E−21 | 0.000000E+00 | −2.073924E−22 | 9.299910E−22 | 1.247675E−16 | −1.068401E−20 |
| Y8 | −9.565501E−21 | 0.000000E+00 | −5.017162E−23 | −8.283404E−22 | −3.764158E−18 | −4.376413E−21 |
| X8Y | 7.278748E−25 | 0.000000E+00 | −1.118538E−23 | −2.775571E−23 | 3.460801E−20 | 9.977498E−25 |
| X6Y3 | 1.052158E−23 | 0.000000E+00 | 5.116150E−25 | −5.328529E−23 | 1.294494E−19 | 3.651595E−24 |
| X4Y5 | 0.000000E+00 | 0.000000E+00 | 1.457517E−25 | −1.988964E−23 | 2.977259E−19 | 1.009834E−23 |
| X2Y7 | 0.000000E+00 | 0.000000E+00 | 3.156995E−26 | 6.916310E−25 | 4.647584E−19 | 2.016596E−23 |
| Y9 | 0.000000E+00 | 0.000000E+00 | −4.348593E−27 | −1.027479E−24 | 7.340789E−20 | 1.110871E−23 |
| X10 | 0.000000E+00 | 0.000000E+00 | −3.950695E−27 | −1.384689E−26 | 0.000000E+00 | −5.360850E−26 |
| X8Y2 | 0.000000E+00 | 0.000000E+00 | −1.366279E−26 | −5.441218E−26 | 0.000000E+00 | −2.218167E−25 |
| X6Y4 | 0.000000E+00 | 0.000000E+00 | 0.000000E+00 | −5.626818E−26 | 0.000000E+00 | −3.417889E−25 |
| X4Y6 | 0.000000E+00 | 0.000000E+00 | 0.000000E+00 | −1.607444E−26 | 0.000000E+00 | −2.595410E−25 |
| X2Y8 | 0.000000E+00 | 0.000000E+00 | 0.000000E+00 | 8.146110E−29 | 0.000000E+00 | −1.130081E−25 |
| Y10 | 0.000000E+00 | 0.000000E+00 | 0.000000E+00 | −8.501369E−28 | 0.000000E+00 | −3.760797E−26 |
| Nradius | 1.00E+00 | 1.00E+00 | 1.00E+00 | 1.00E+00 | 1.00E+00 | 1.00E+00 |
| Y-decenter | −142.443 | −93.914 | 42.888 | −6.282 | −4.405 | −11.420 |
| X-rotation | −9.038 | −14.602 | 1.511 | −3.471 | −7.366 | −2.186 |

In FIG. 3, projection objective 300 is shown in meridional section. The meridional plane is a symmetry plane for projection objective 300. Symmetry about the meridional plane is as the mirrors are decentered only with respect to the y-axis and tilted about the x-axis. Further, the coefficients for the freeform mirrors having an odd degree in the x-coordinate (e.g., x, $x^3$, $x^5$, etc.) are zero.

Projection objective 300 is configured for operation with 13.5 nm radiation and has an image-side NA of 0.35 and a track length L of 1,490 mm. The optical path length of imaged radiation is 4,758 mm. Accordingly, the ratio of optical path length to track length is approximately 3.19. Projection objective has a de-magnification of 4×, a maximum distortion of less than 2 nm, a wavefront error WRMS of 0.030λ, and a field curvature of 30 nm. Additional characteristics of projection objective 300 are presented in the discussion of projection objective 101 that follows.

The first mirror in the radiation path from object plane 103, concave mirror 310, has positive optical power. Mirrors 330, 340, and 360 are also concave P mirrors. Convex mirrors 320 and 350 have (N) negative optical power. The sequence of mirrors in the radiation path in projection objective 300 is thus PNPPNP.

For the mirrors in projection objective 300, the maximum deviation of the freeform surfaces from a best fit sphere is significantly more than one micrometer for each mirror.

Projection objective 300 images radiation from object plane 103 to an intermediate image at a location 305 near mirror 360. Embodiments that have one or more intermediate images, also include two or more pupil planes. In some embodiments, at least one of these pupil planes is physically accessible for the purposes of placing an aperture stop substantially at that pupil plane. An aperture stop is used to define the size of the projection objective's aperture.

Figure 4:
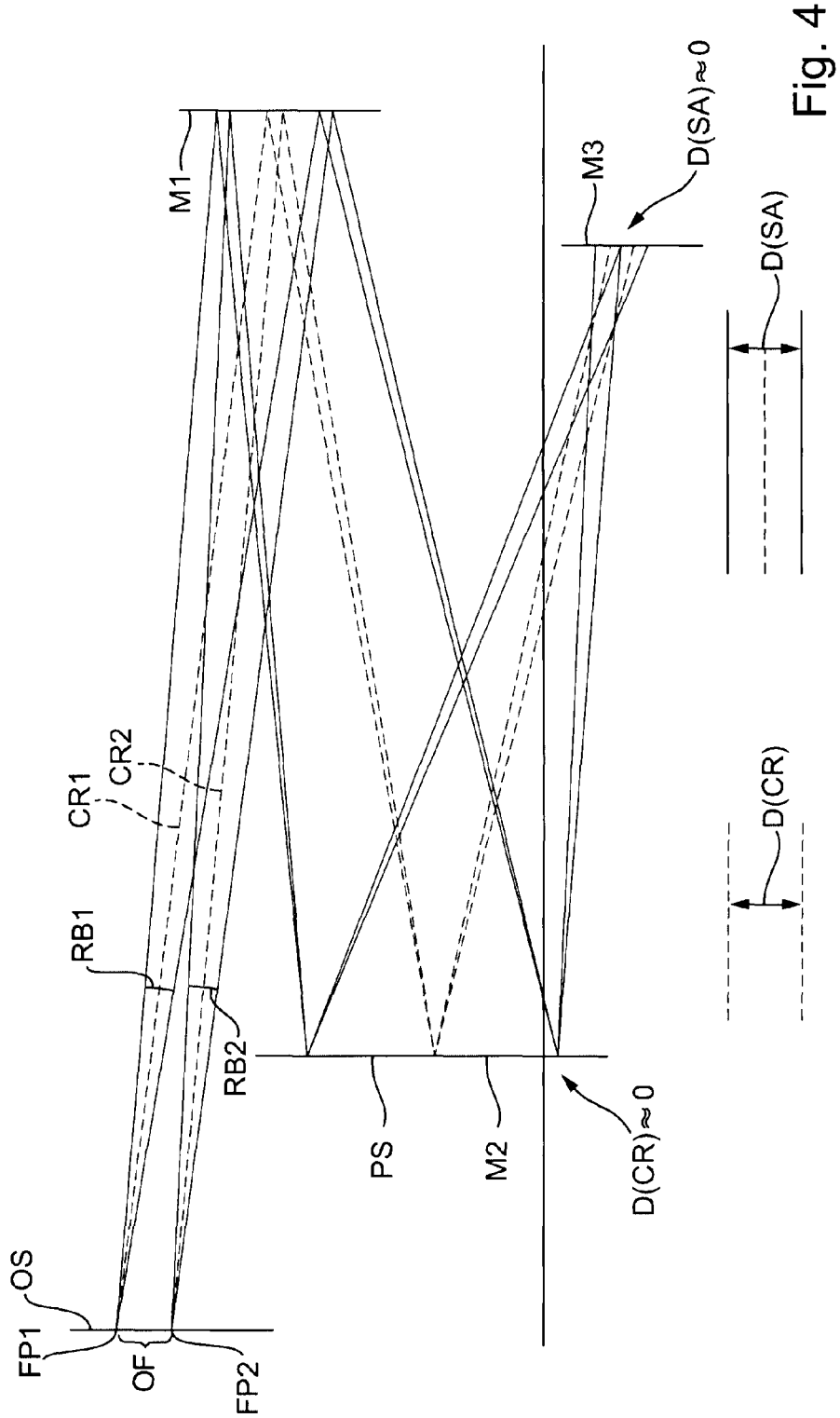
FIG. 4 is a schematic diagram illustrating conditions for mirrors near to a pupil surface and near to a field surface.

Each mirror in projection objective 100 can also be characterized by parameters defining the position of the mirror along the path of radiation in terms of proximity or distance from a field surface or a pupil surface, respectively. Reference is made to schematic FIG. 4 showing three mirrors M1, M2, M3 of a projection objective. Consider a field point FP1 in the object surface OS. A ray bundle RB1 (cone of radiation) having an opening angle proportional to the object-side numerical aperture originates at object field point FP1. As the optical distance from the object surface (corresponding to a field surface) increases, the diameter of such ray bundle increases. Where the ray bundle is incident on an optical surface, the ray bundle may be characterized by a "sub-aperture" of the ray bundle, where the sub-aperture is the area on the optical surface illuminated by the cone of light projected onto the x-y plane. Whereas sub-apertures of different field points FP1 and FP2 laterally offset in the object surface are laterally separated in regions close to the field surface, the sub-apertures of different field points overlap completely in a pupil surface. In a field surface, the diameter D(SA) of a sub-aperture is zero, whereas in a pupil surface the diameters of sub-apertures corresponding to different field points are substantially equal, and the sub-apertures overlap completely.

Now, consider a meridional section of an effective object field OF in the object surface as shown in FIG. 4. The effective object field includes the plurality of field points actually used for the imaging process. In scanning systems, for example, the effective object field may be rectangular or arcuate with a high aspect ratio between width (in x-direction) and height (measured in the scanning direction, i.e. the y.direction). The diameter of the effective object field in the meridional plane corresponds to a maximum distance of chief rays, D(CR) in the object surface. The chief rays CR1 and CR2 corresponding to field points, FP1 and FP2 are drawn in dashed lines in FIG. 4 (In an optical system essentially telecentric on the object side, the chief rays are nominally orthogonal to the object plane.) As the chief rays propagate through the optical system, the distance D(CR) between the chief rays eventually decreases between a field surface and a subsequent pupil surface. The optical position of a pupil surface PS may be defined as the position where the chief rays CR1 and CR2 intersect. Therefore, the distance between the chief rays, D(CR), approaches zero close to a pupil surface and the condition D(CR)=0 is fulfilled at a pupil surface. Based on these considerations, a parameter $$P(M):=D(SA)/(D(SA)+D(CR))$$

may be defined to characterize the optical proximity or distance of an optical surface M from a field surface or a pupil surface, respectively. Specifically, if the optical surface is positioned exactly in a field surface, D(SA) is =0 such that P(M)=0. On the other hand, if the optical surface M is exactly in a pupil surface, D(CR)=0 such that P(M)=1.

In Table 3B the parameters D(SA), D(CR) and P(M) are given for each of the mirrors in projection objective 300.

TABLE 3B

| Mirror # | D(SA) [mm] | D(CR) [mm] | P(M) |
|---|---|---|---|
| 1 | 133.866 | 14.169 | 0.904 |
| 2 | 57.437 | 0.612 | 0.989 |
| 3 | 252.144 | 19.443 | 0.928 |
| 4 | 185.001 | 18.222 | 0.910 |
| 5 | 69.698 | 1.238 | 0.983 |
| 6 | 236.567 | 1.985 | 0.992 |

In the exemplary embodiment of FIG. 3 mirror 350 (M5, geometrically closest to the image surface, P(M)=0.983) is optically close to a pupil surface. Also, mirror 320 (M2) geometrically closest to the object surface (with P(M)=0.989) and mirror 360 (M6) (with P(M)=0.992) are optically close to a pupil surface In contrast, mirrors 310 (M1), 330 (M3) and 340 (M4) (all with P(M)<0.93) are optically closer to a field surface.

Where it is desired to correct a certain amount of field variation of pupil apodization the apodization correction element may not be placed exactly in a pupil position (where P(M)=1), but at a distance therefrom where P(M)<1 such that the sub-apertures of ray bundles originating from different field points do not overlap completely at the position of the apodization correcting element. Since none of the mirrors 1 through 6 is placed exactly in a pupil surface, an apodization correcting element may be formed on each one of the mirrors 1 through 6. Where desired, two or more of the mirrors may be designed to cause, in combination, a desired apodization correcting effect.

Figure 5:
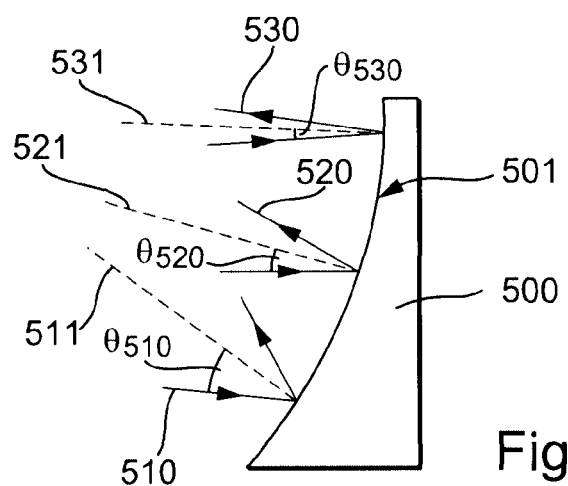
FIG. 5 is a cross-sectional view of a portion of a mirror from a projection objective shown in meridional section.

In general, the percentage of radiation at λ reflected by a mirror varies as a function of the angle of incidence of the radiation on the mirror surface. Because imaged radiation propagates through a catoptric projection objective along a number of different paths, the angle of incidence of the radiation on each mirror can vary. This effect is illustrated with reference to FIG. 5, which shows a portion of a mirror 500, in meridional section, that includes a concave reflective surface 501. Imaged radiation is incident on surface 501 along a number of different paths, including the paths shown by rays 510, 520, and 530. Rays 510, 520, and 530 are incident on portions of surface 501 where the surface normal is different. The direction of surface normal at these portions is shown by lines 511, 521, and 531, corresponding to rays 510, 520, and 530, respectively. Rays 510, 520, and 530 are incident on surface 501 at angles $\theta_{510}$, $\theta_{520}$, and $\theta_{530}$, respectively. In general, angles $\theta_{510}$, $\theta_{520}$, and $\theta_{530}$ may vary.

For each mirror in projection objective 101, the incident angles of imaged radiation can be characterized in a variety of ways.

One characterization is the maximum angle of incidence, $\theta_{max}$, of rays running in a meridional section of projection objective 100 on a mirror. Another characterization is the minimum angle of incidence, $\theta_{min}$, of rays running in a meridional section of projection objective 100 on each mirror.

Each mirror in projection objective 100 can also be characterized by the maximum difference of angles of incidence of rays in the meridional section of the projection objective, where the maximum difference Δθ corresponds to the difference between $\Delta\theta_{max}$ and $\Delta\theta_{min}$.

Each mirror in projection objective 100 can also be characterized by the angle of incidence of a chief ray corresponding to a central field point of the projection objective on a respective mirror. This incidence angle will be denoted as chief ray angle of incidence, $\Delta\theta_{CR}$.

Table 3C summarizes the values mentioned above for all mirrors of projection objective 300.

TABLE 3C

| Mirror | CR [°] | max [°] | [°] |
|---|---|---|---|
| M1 | 3.69 | 4.27 | 1.23 |
| M2 | 10.09 | 10.85 | 3.23 |
| M3 | 6.48 | 7.56 | 3.70 |
| M4 | 10.00 | 14.22 | 10.16 |
| M5 | 13.73 | 24.09 | 23.41 |
| M6 | 7.14 | 8.77 | 3.89 |

Figure 6:
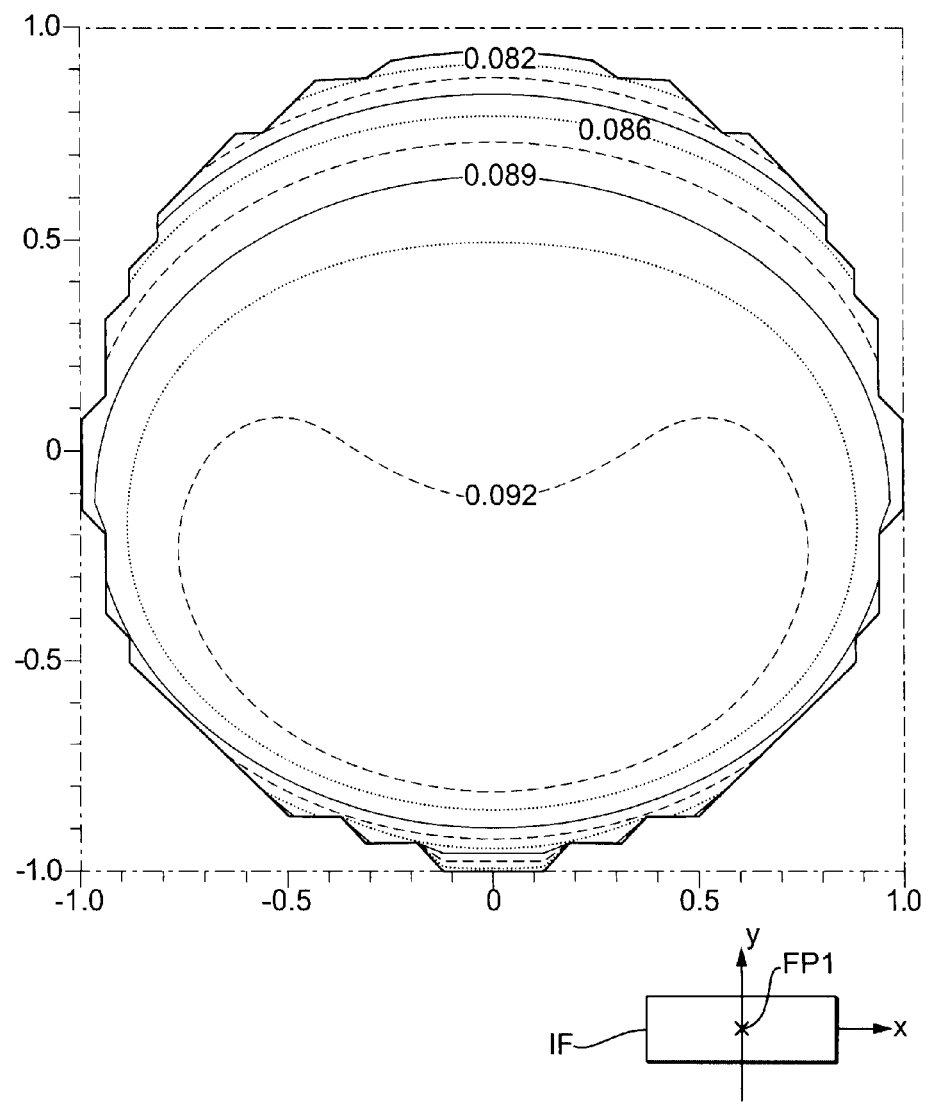
FIG. 6 shows a schematic plot of the spatial intensity distribution in the circular exit pupil of the projection objective for a central field point in a reference system without apodization correcting element.
Figure 7:
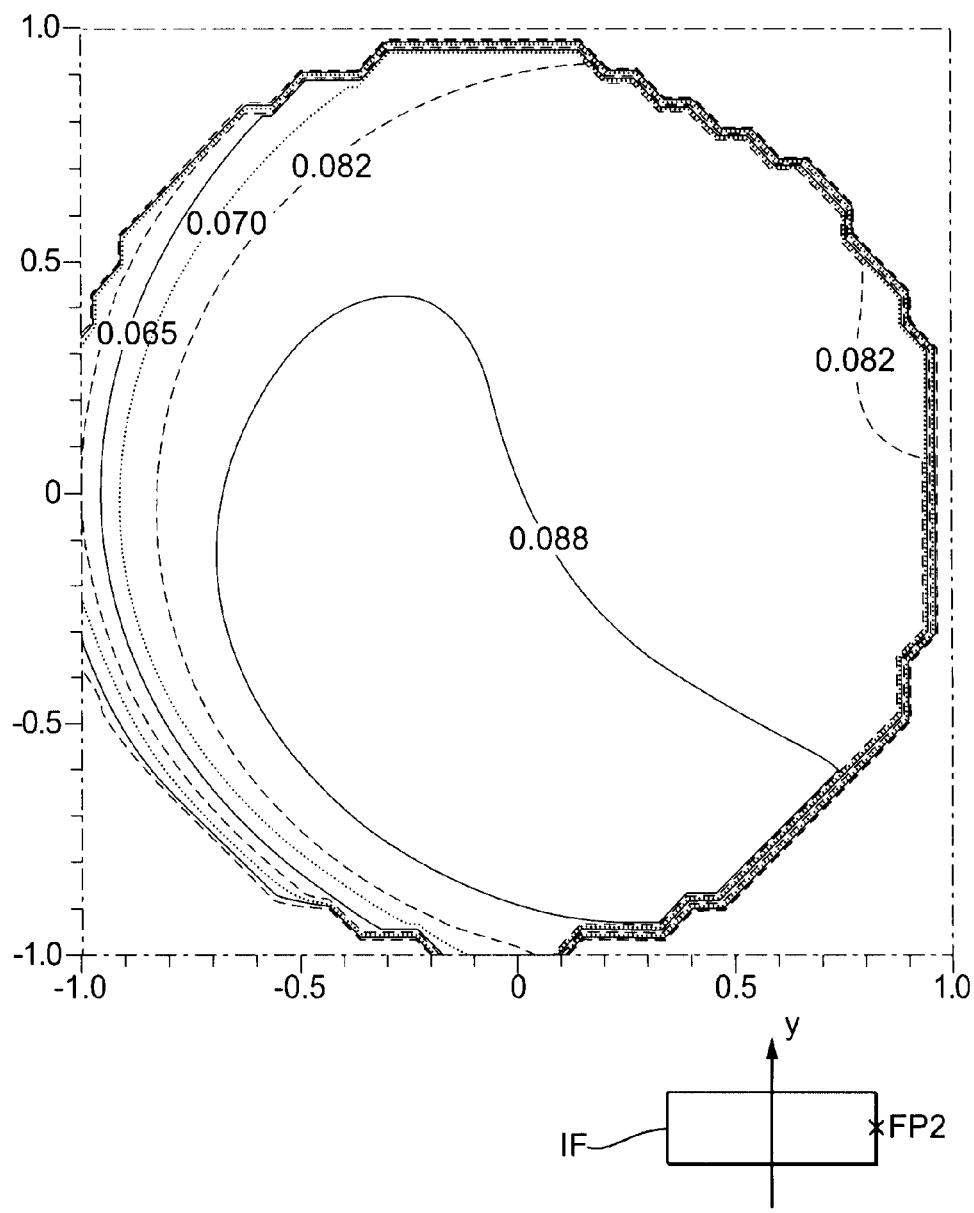
FIG. 7 shows a schematic plot of the spatial intensity distribution in the circular exit pupil of the projection objective for a field point at the edge of the rectangular image field in the x direction in a reference system without apodization correcting element.

The exemplary embodiment includes a number of reflective freeform surfaces having no rotational symmetry. It has been found that a significant variation of apodization across the image field exists. The apodization characteristics are demonstrated in FIGS. 6 and 7. FIGS. 6 and 7 present schematic plots of the spatial intensity distribution in the circular exit pupil of the projection objective for two different image field points FP1, FP2. FIG. 6 plots the distribution for field point FP1 lying at the center of the rectangular image field IF on the y axis, which is the symmetry axis of the projection objective, and FIG. 7 plots the distribution for a field point FP2 at the edge of the rectangular image field. The numbers associated with different contour lines represent the level of intensity at the respective pupil locations as a fraction of the intensity at the entrance of the projection objective (at the object surface).

The pupil distribution corresponding to the center field point FP1 exhibits a relatively weak apodization with a maximum value 0.092 in the lower part of the exit pupil and a decreasing intensity towards the upper edge to a minimum value of about 0.082. The intensity distribution is essentially mirror symmetric to the meridional plane which forms the symmetry plane of the projection objective. On the other hand, the amount of apodization of the pupil corresponding to the edge field point FP2 is significantly larger, ranging from about 0.088 close to the center of the pupil towards 0.060 at the left edge of the pupil. Further, the intensity distribution is not symmetrical. A comparison of FIGS. 6 and 7 shows a relatively large variation of pupil apodization across the filed in the cross-scan direction (x direction) oriented perpendicular to the scanning direction (y direction) of the rectangular field.

A symmetrical distribution of intensity at the pupil surface would be desirable from an imaging point of view. For example, contrast differences depending on the structure orientation (H-V differences) may be avoided where the intensity distribution in the exit pupil is essentially rotationally symmetric.

The level of symmetry of the intensity distribution in the exit pupil may be de-scribed in a variety of ways. For example, the spatial intensity distribution may be described in terms of Zernike polynomials {$Z_n(r, \phi)$} which form a complete orthonormal function system in a unit circle which may be described in terms of polar coordinates (r, φ). The Zernike polynomials may be subdivided into rotationally symmetric polynomials and non-rotationally symmetric polynomials. A deviation from a complete rotationally symmetry in the circular exit pupil may therefore be described in terms of the root-mean-square (rms) value of the non-rotationally Zernike polynomials, which are equal to zero in a perfectly rotationally symmetric distribution and which should be a small as possible where rotational symmetry is desired. In this respect, embodiments having an apodization correcting element effective to increase rotational symmetry may be discerned by the fact that the rms value of the non-rotational symmetric Zernike polynomials is decreased when the apodization correcting element is introduced into the optical system.

Another way to describe and quantify the rotational symmetry of the exit pupil (or a deviation therefrom) is to consider the local intensity distribution at the outer edge of the exit pupil (corresponding to the largest aperture rays) in the azimuthal (circumferential) direction. Pupil coordinates at or close to the outer edge of the exit pupil correspond to rays incident on the image surface with the largest aperture angles. Those rays typically define the resolution limit of the optical system at the image-side numerical aperture used. If the local intensity of the exit pupil is about the same for all positions at or close to the outer edge of the exit pupil those rays would contribute with comparable intensity to image formation. On the other hand, significant variations of critical dimensions may occur where the intensity at the outer edge of the exit pupil varies significantly in the circumferential (azimuthal) direction. An apodization parameter APO may be defined characterizing the normalized azimuthal variation of intensity in an edge region of the exit pupil in the azimuthal direction according to $$APO=(I_{MAX}-I_{MIN})/(I_{MAX}+I_{MIN}).$$

In this equation, $I_{MAX}$ is a maximum intensity in the outer edge region of the exit pupil and $I_{MIN}$ is the minimum value of the intensity in this outer edge region such that a non-zero value of apodization parameter APO indicates a deviation from perfect rotational symmetry for the critical rays originating from the outer edge region of the exit pupil.

The spatial intensity distribution corresponding to the edge field point FP2 shown in FIG. 7 may be describe by a minimum value $I_{MIN}$=0.47 at the leftmost edge (in the x direction) and a maximum value $I_{MAX}$=0.90 at the lower right edge of the exit pupil such that APO=0.314 (note that the contour lines in FIG. 7 and other corresponding figures indicate the intensity distribution semi-quantitative, whereas the analysis presented above has been performed on the actual values calculated for the optical system). It will be demonstrated below that an improvement of rotational symmetry particularly at the outer edge of the exit pupil may be obtained by providing an appropriate apodization correcting element.

An analysis of contributions of each of the reflecting mirrors to pupil apodization shows that a relatively large contribution to field dependent apodization originates from mirror 350 (M5), geometrically closest to the image surface, optically close to a pupil surface. It can be seen from table 3C above that the chief ray angle of incidence, $\theta_{CR}$, as well as the maximum angle of incidence, $\theta_{max}$ in the meridional section and the maximum difference, $\Delta\theta$, of rays in the meridional section have the relatively highest value for mirror 350 (mirror M5).

Figure 8:
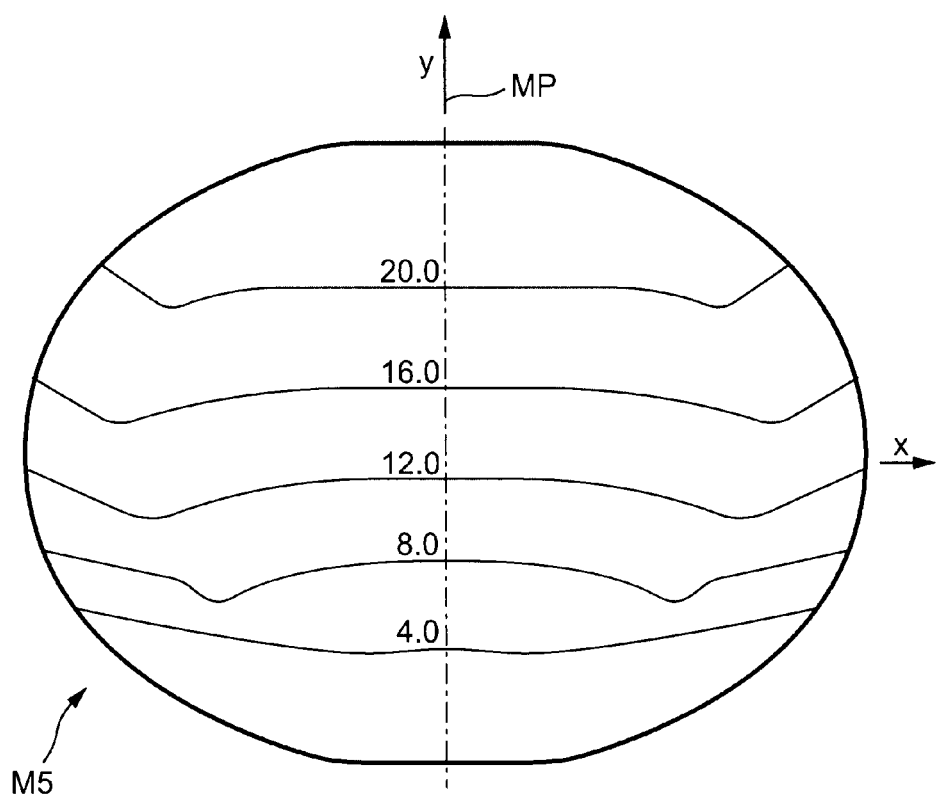
FIG. 8 shows a schematic diagram for the spatial distribution of average angles of incidence on mirror M5 in FIG. 3.

Mirror 350 (M5) is situated relatively close to a pupil surface (P(M)=0.983). Mirror M5 is subject to relatively large variations of the angles of incidence. This is qualitatively shown in FIG. 8, which shows a schematic diagram for the spatial distribution of average angles of incidence, $\theta_{avg}$, on mirror M5 in FIG. 3. In the figure, a generally elliptic shape of the utilized mirror surface is shown together with contour lines connecting locations having the same average angles of incidence as indicated for each contour line. It is evident that the distribution of average angles of incidence is symmetric to the meridional plane MP. The lowest value for the average angle of incidence is obtained at the lower edge ($\theta_{avg}$<4°), whereas relatively large values are obtained at the upper edge ($\theta_{avg}$>20°). The average angle of incidence varies substantially in the first direction (y-direction, lying in the meridional plane MP) between the lower edge and the upper edge of the mirror by more than 10° or more than 15°, for example. On the other hand, there is relatively little variation of the average angle of incidence in the second direction perpendicular to the first direction, i.e. perpendicular to the meridional plane. For example, in the center region of the mirror between upper edge and lower edge, the absolute value of the average angle of incidence is between about 12° and about 16° and does not vary by more than 4° or more than 3°, for example. Therefore, in a first approximation, the average angle of incidence varies strongly according to a roughly linear function in the first direction (y-direction, in the meridional plane MP), whereas the average angle of incidence is essentially constant in the second direction perpendicular thereto.

As will explained in more detail below, specifically designed graded coatings on mirrors with characteristic variations of average angles of incidence can be applied to compensate some of the negative effects of incidence angle variation on reflectivity of mirrors such that a mirror may have only little variation of reflectivity despite relatively large variations of average angles of incidence across the mirror surface. Specifically, as will be explained below, mirror M5 is provided with a non-rotational symmetric coating designed as a one-dimensionally graded coating including a multilayer stack of layer of different materials, where the lay-ers have a geometrical layer thickness which varies according to a first grading function in the first direction of the coating (in the meridional plane) and which is substantially constant in the second direction perpendicular to the first direction. Coatings of this type are referred to as "linearly tilted coating" in this application. With regard to structure and advantages of linearly tilted coatings reference is made to U.S. provisional patent application No. 60/872,503 filed on Dec. 4, 2006, the disclosure of which is incorporated herein by reference.

Each of the mirrors is coated with a reflective coating including a multilayer stack of layers of different materials. Such multilayer stacks can include about 20 or more, such as about 30 or more, about 40 or more or about 50 or more layers. In the exemplary embodiment, multiple alternating layers of molybdenum and silicon are used to form reflective coatings effective for EUV radiation wave-lengths in a range from about 10 nm to about 15 nm, specifically between about 13 nm and 14 nm.

The reflective coatings were optimized for EUV lithography systems operating at 13.5 nm with NA=035. Optimization was performed using a coating stack (multilayer stack) as shown in Table 3D.

TABLE 3D

| Material | Thickness [nm] | Function |
| --- | --- | --- |
| ASLayer (n = 0.99946, k = 0.0) | 167.60 | Anti stress layer (no optical function, does not influence reflectivity, because it is to far below the top surface) |
| Si | 3.66 | Bilayer structure for High |

TABLE 3D-continued

| Material | Thickness [nm] | Function |
|---|---|---|
| MoSi | 0.8 | reflectance multi layer, |
| Mo | 1.64 | repeated 46 times. |
| MoSi | 0.8 | |
| Si | 3.73 | Last layer, interface to vacuum. |
| MoSi | 0.8 | Cap Layer, Ruthenium |
| Mo | 1.44 | |
| Ru | 1.5 | |

Table 3D shows the order of layers of the coating stack from the bottom surface (close to the substrate) to the top surface (in contact with vacuum). Si designates Silicon, while Mo designates Molybdenum. MoSi stands for an interlayer between Molybdenum and Silicon, which in a real coating stack is a result of inter-diffusion between the two layers. The interdiffusion layer was introduced to obtain a more physically relevant model. No interface roughness was considered in the calculation. As evident from the table, the multilayer stack includes a bilayer structure of relatively thick Silicon layers and relatively thin Molybdenum layers, which are repeated forty-six times in the multilayer stack. An anti stress layer (ASL) is positioned between the bilayer structure and the substrate. The anti stress layer has no optical function as it is positioned remote from the interface to vacuum. It does not influence reflectivity but improves mechanical stability of the reflective coating.

Figure 9A:
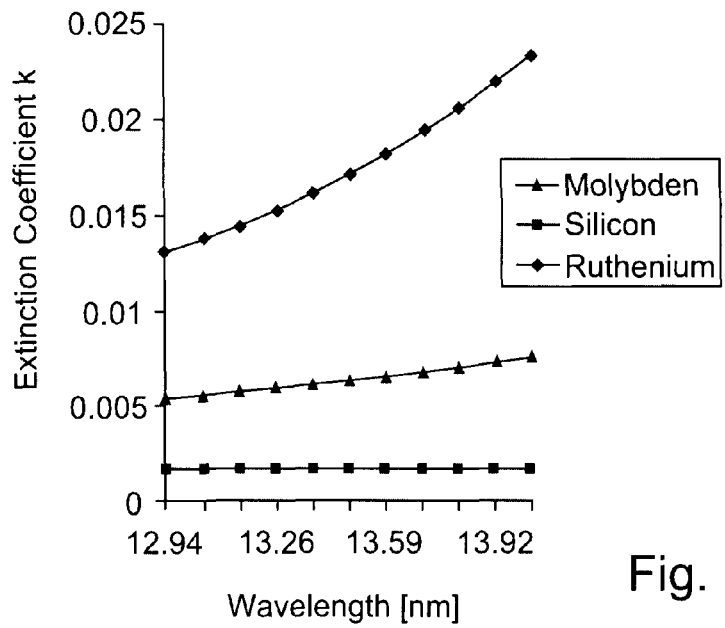
FIG. 9 shows diagrams for the specific absorption coefficient k (FIG. 9A) and the refractive index (FIG. 9B) of materials used in a EUV reflective mirror with cap layer.
Figure 9B:
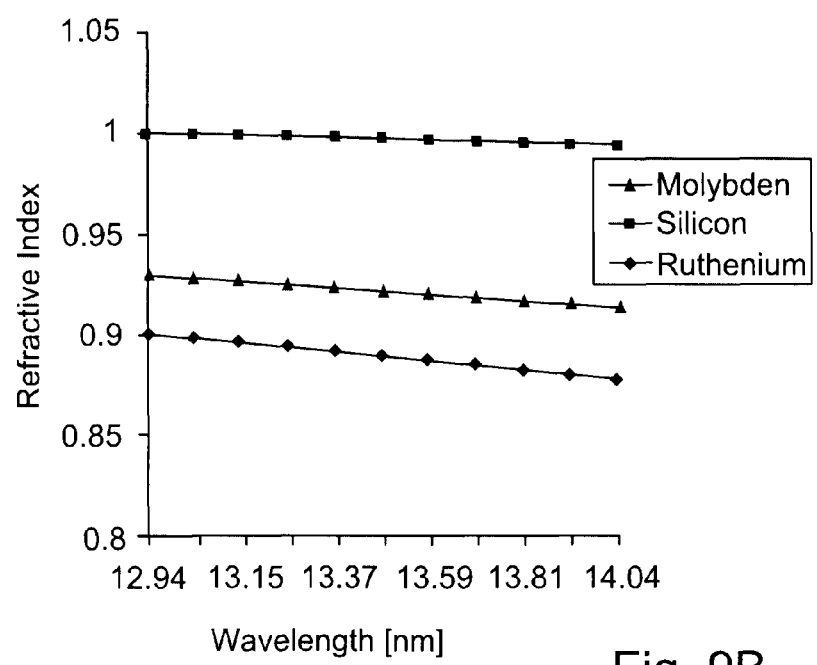

A cap layer made of ruthenium is used on each of the mirrors. The cap layer is the layer on a radiation entry side of the reflective coating facing away from a mirror substrate. The cap layer is adjacent to the environment, which may be a vacuum in an assembled system and which may be air or another gas in during manufacturing and storage of the mirror. As evident from FIG. 9A the cap layer material ruthenium has an extinction coefficient k greater than 0.013 in a wavelength range between about 13 nm and 14 nm, where the extinction coefficient is about 0.015 or more in the region of a wavelength band pass from about 13.4 nm to 13.6 nm. On the other hand, molybdenum and silicon forming the bilayer structure below the cap layer have significantly smaller specific absorbance, characterized by an extinction coefficient k<0.008. As seen from 9B, the refractive index of ruthenium is generally between about 0.9 and 0.88 in the same wavelength range, which is significantly smaller than the refractive index of molybdenum (between about 0.925 and 0.92) and silicon (between about 1.01 and 0.99) in the same wavelength range.

Optimization was performed by maximizing the overall transmission T of the optical system as retrieved by ray tracing a representative sample of all field points and averaging over all those rays. This approach is similar to averaging over the spatial reflectance distribution of each mirror. The transmission spectrum was optimized as an integrated value over a band pass from 13.36 nm to 13.64 nm.

One or more mirrors may have reflective coatings having a uniform layer thick-ness. At least one of the mirrors may have a graded coating characterized by non-zero gradient of a layer thickness of the reflective coating in at least one direction of the mirror surface.

The layer thickness profiles of graded coatings may be described as a variation of geometrical (physical) layer thickness relative to a local position (x,y) on a mirror surface. At each location, the layer thickness may be measured along the surface normal, i.e. perpendicular to a tangent to the mirror surface at the respective location. The real (geometrical) layer thickness $d(x,y)$ may then be described as a product of a nominal thickness, $d_0$, and a modification factor $fac(x, y)$, which depends on the location.

In some embodiments, the local geometrical film thickness $d(x, y)$ of the layers of the multilayer stack deviates by $\lambda/100$ or less (or $\lambda/1000$ or less) from a grading function according to $$d(x,y) = d_0 \cdot \max(0, fac(x,y)) \quad (3),$$

where $$fac(x,y) = c_0 + c_{1y} \cdot y + c_2 \cdot r(x,y)^2 \quad (4),$$

wherein $r(x,y) = \sqrt{x^2 + y^2}$, where y is a coordinate in the first direction, x is a coordinate in the second direction, $d_0$ is a nominal thickness measured in a z direction normal to the reflective surface perpendicular to the x and y direction in a local coordinate system of the reflective surface. Introducing the max ( ) function prevents the function $d(x, y)$ from attaining values smaller then zero. In this polynomial expression for $fac(x, y)$ the grading profile may be understood as a superposition of a constant value ($c_0$), and a "tilting" of the coating in y-direction (corresponding to a linear variation of layer thickness in the direction in the meridional plane) and a rotational symmetric parabolic term. Therefore, in a grading according to a linear grading function (tilted coatings), the term $c_{1y}$ deviates from 0 and the parabolic constant $c_2=0$. In a parabolic coating, $c_{1y}=0$ and $c_2 \neq 0$. Mixed graded coatings with $c_{1y} \neq 0$ and $c_2 \neq 0$ are possible.

In mirrors designed for reflecting EUV radiation a reflective coating is typically formed by a stack of so-called bilayers, where a bilayer includes a relatively thick layer of a first material (such as silicon) having a first refractive index and a relatively thin second layer of a second material (such as molybdenum) having a second refractive index which is higher than the first refractive index. In general, a thickness ratio ($\gamma$ factor) between the thicknesses of the first layer and second layer should be maintained essentially constant in such bilayer although the absolute thickness of the bilayer may vary across the mirror surface in a graded coating. In cases where such bilayers are used, the above condition also applies for the geometrical thickness $d(x,y)$ of the bilayer.

Absolute values for parameters $c_0$, $c_{1y}$ and $c_2$ may vary depending on the design of the optical system. Specifically, those parameters will vary depending on the numerical aperture NA of the projection objective which also determines the angles of incidence and related properties of the rays passing through the optical system. In some embodiments, the condition $0.90 \leq c_0 \leq 1.2$ or the condition $0.95 \leq c_0 \leq 1.05$ applies, such as $0.98 \leq c_0 \leq 1.02$. In some embodiments the amount of the parameter $c_{1y}$ may be 0.1 or less, for example 0.01 or less. Sometimes, the condition $0.001 \leq c_{1y} \leq 0.002$ applies. In some embodiments, the absolute value of parameter $c_2$ is $10^{-5}$ or less, such as $10^{-6}$ or less. The absolute value of parameter $c_2$ may be $10^{-8}$ or more, such as $10^{-7}$ or more.

These values apply for a nominal thickness $d_0=6.9$ nm and allow to calculate the real physical thickness of the graded coating according to the respective grading function. If a different nominal thickness $d_0$ were used, the same physical thickness of the graded coating would be obtained with a different set of values for the parameters i, $c_{1y}$ and $c_2$. Therefore, also conversions based on different values for $d_0$ shall be covered by these exemplary parameter values.

The modulation factor $fac(x, y)$ is defined in a local coordinate system of the mirror. The origin of the local coordinate system may or may not coincide with a reference axis of the optical system, i.e. it may be centred or decentred with respect to that reference axis. The reference axis may coincide with an optical axis of the optical system. However, systems having no optical axis may also be utilized.

Table 3E presents, for each of the mirrors, the parameters c0, c1y and c2 of equation (4) from which the geometrical layer thicknesses, d(x, y,) of the single layers of the multilayer stack are calculated. Furthermore, the maximum reflectance $R_{max}$ [%] within the band path from 13.36 to 13.64 nm, obtained by averaging over the whole mirror, is given for each of the mirrors. An average transmission $T_{AVG}$=7.33% and a maximum transmission $T_{MAX}$=8.86 are obtained.

TABLE 3E

| | NA = 0.35 | | | |
|---|---|---|---|---|
| Mirror | c0 | c1y | c2 | Rmax [%] |
| M1 | 1.007 | 0 | 0 | 68.1 |
| M2 | 1.025 | 0 | 0 | 66.6 |
| M3 | 1.007 | 0 | 3.0e−6 | 67.9 |
| M4 | 0.996 | 0 | 3.044e−5 | 67.3 |
| M5 | 1.123 | 0.15e−2 | 0 | 63.0 |
| M6 | 1.014 | 0 | 0 | 67.6 |

In view of the fact that coefficient c1y represents a linear term indicating an increase or decrease of layer thickness in the y direction (first direction, in the meridional plane) and parameter c2 represents a parabolic term, it can be seen that mirrors M1, M2, and M6 each have a reflective coating with uniform thickness of all layers. In contrast, mirrors M3, M4 and M5 each have a graded reflective coating having non-uniform layer thickness in the meridional direction. Specifically, mirrors M3 and M4 each have a rotationally symmetric graded coating with a parabolic shape. Mirror M5 optically close to a pupil surface, has a one-dimensionally graded coating where the layer thickness increases linearly along the first direction (in the meridional section) according to coefficient c1y, whereas the layer thickness does not vary along the second direction perpendicular thereto (perpendicular to the drawing plane in FIG. 3).

Figure 10:
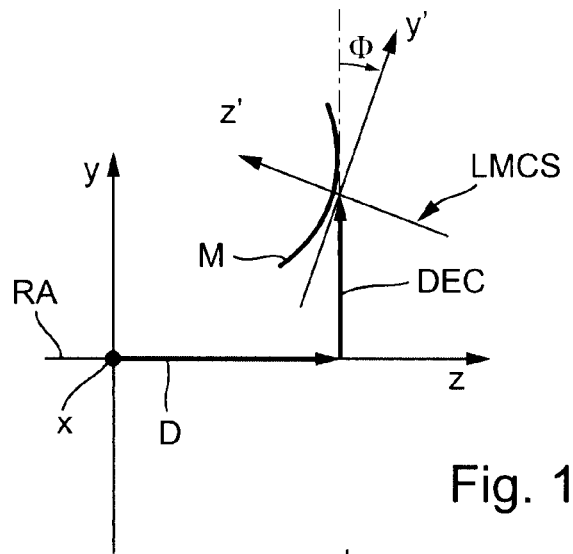
FIG. 10 shows a schematic drawing of a local mirror coordinate system LMCS on a mirror.

In FIG. 10 a schematic drawing of a local mirror coordinate system LMCS with axes x', y' and z' on a mirror M is shown. The origin of LMCS is decentered by DEC relative to the reference axis RA in the y-direction and has a distance D from the origin of the coordinate system CS of the optical system along the reference axis.

Figure 11A:
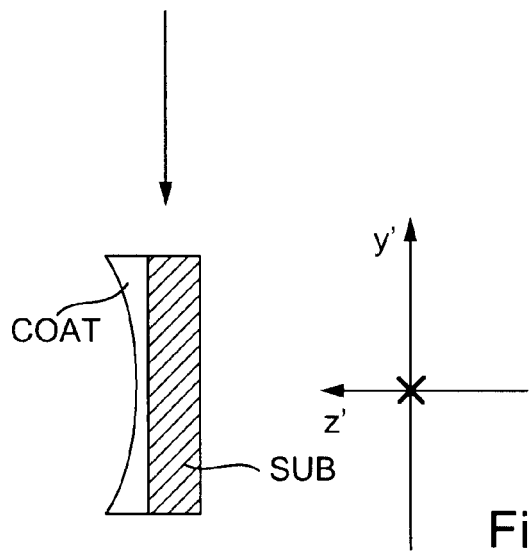
FIG. 11 shows schematic drawings of graded coatings, where the geometrical layer thickness of the individual layers varies according to a parabolic function in FIG. 11A and according to a linear grading function (tilted coating) in FIG. 11B.

FIG. 11A shows a schematic drawing of a graded reflective coating COAT on a substrate SUB, where the geometrical layer thicknesses of the individual layers of the multilayer stack vary rotationally symmetric around the z' axis according to a parabolic function. Such parabolic coating may, for example, be applied to mirror M3 and mirror M4.

Figure 11B:
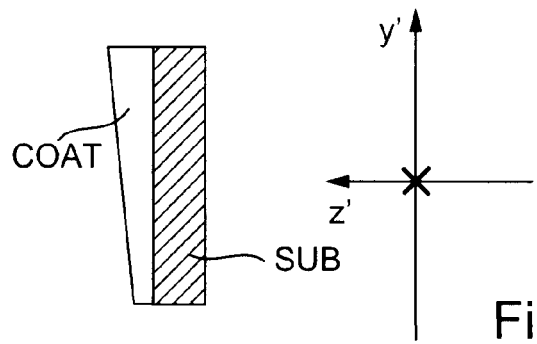

FIG. 11B shows a schematic drawing of a one-dimensionally graded coating COAT according to a linear grading function. An exemplary embodiment of such linearly tilted coating is applied to pupil mirror M5.

It has been found that tilted graded coatings, such as formed on mirror M5, which may be advantageous in terms of improving overall transmissions, for example, tend to break a rotational symmetry of optical systems and, therefore, may contribute substantially to generating field-dependent apodization.

Based on this analysis a modified projection objective 100 was designed, which includes an apodization correcting element effective to decrease the field dependence of apodization. A method of designing such apodization correcting element may include the following steps:

(Step 1) Calculating, for a plurality of field points distributed across the image field, a pupil apodization represented by a spatial intensity distribution at the exit pupil of the optical system;

(Step 2) Calculating sub-apertures on each of the mirror elements for a number of field points including a number of field points close to or at the edge of the image field and close to or at the center of the image field.

(Step 3) Selecting, from the plurality of mirrors, a mirror where the sub-apertures of problematic field points close to or at the edge of the field are relatively positioned to each other such that the surfaces to be reduced in intensity of the pupil do not overlap with sub-apertures of other field points Where those "freely accessible" sub-apertures are present, the intensity distribution in the exit pupil can be modified by modifying the relative reflectivities of the mirror element in the areas of the sub-apertures.

(Step 4) Modifying reflectance of the mirror surface in the regions of the critical field sub-apertures such that a symmetry of the spatial intensity distribution in the exit pupil is increased.

For many applications a completely homogenous intensity distribution in the exit pupil may be desirable, which could be considered as a highly symmetric intensity distribution. In may practical cases it may be sufficient to improve symmetry such that the intensity distribution and the exit pupil is more rotationally symmetric as in the case without an apodization correcting element. A first and at least one second apodization correcting element may be used in some cases. For ex-ample, a first apodization correcting element may be optimized to minimize the field variation of pupil apodization, and a second apodization correcting element adapted to the first apodization correcting element may be used to effect further corrections. For example, an apodization correcting element placed very close to or at a pupil surface may be used to correct contributions to pupil apodization which are essentially constant across the entire field. Therefore, a combination of at least two mutually adapted apodization correcting elements may be used in embodiments.

It can be seen from step 3 that the mirror element to be used as an apodization correcting element to influence the field dependence of apodization may not be positioned exactly in the pupil since the sub-apertures of all field points overlap essentially in the pupil surface. In many cases the reflective mirror to be modified may also not be positioned exactly in or very close to a field surface since in that case all rays of a ray bundle would be incident in one common point of incidence such that a change of reflectance in the location of the point of incidence would effect all locations in the exit pupil in the same way, thereby making it impossible to modify the relative intensity levels at different locations in the pupil.

The analysis revealed that mirror 320 (mirror M2) may be used to be modified such that the mirror forms or includes an apodization correcting element. As seen from table 3C P(M)= 0.989 for mirror 320, indicating that the mirror is close to, but at a sufficient optical distance from a pupil surface.

The field dependent apodization described in connection with FIGS. 6 and 7 may be described more generally such that a significant asymmetry of the pupil intensity distribution is present for edge field points at or close to the left and right shorter edges of the image field, whereas apodization is relatively small at the center of the image field and generally along a central region on both sides of the symmetry plane.

The mirror element to be modified as an apodization correcting element may be selected such that the critical edge field points (showing significant asymmetry of pupil apodization) and relatively uncritical next neighbours thereof (closer to the symmetry plane) correspond to regions freely accessible at the outer edge of the mirror (i.e. regions with little or no overlap of corresponding sub-apertures).

Figure 12:
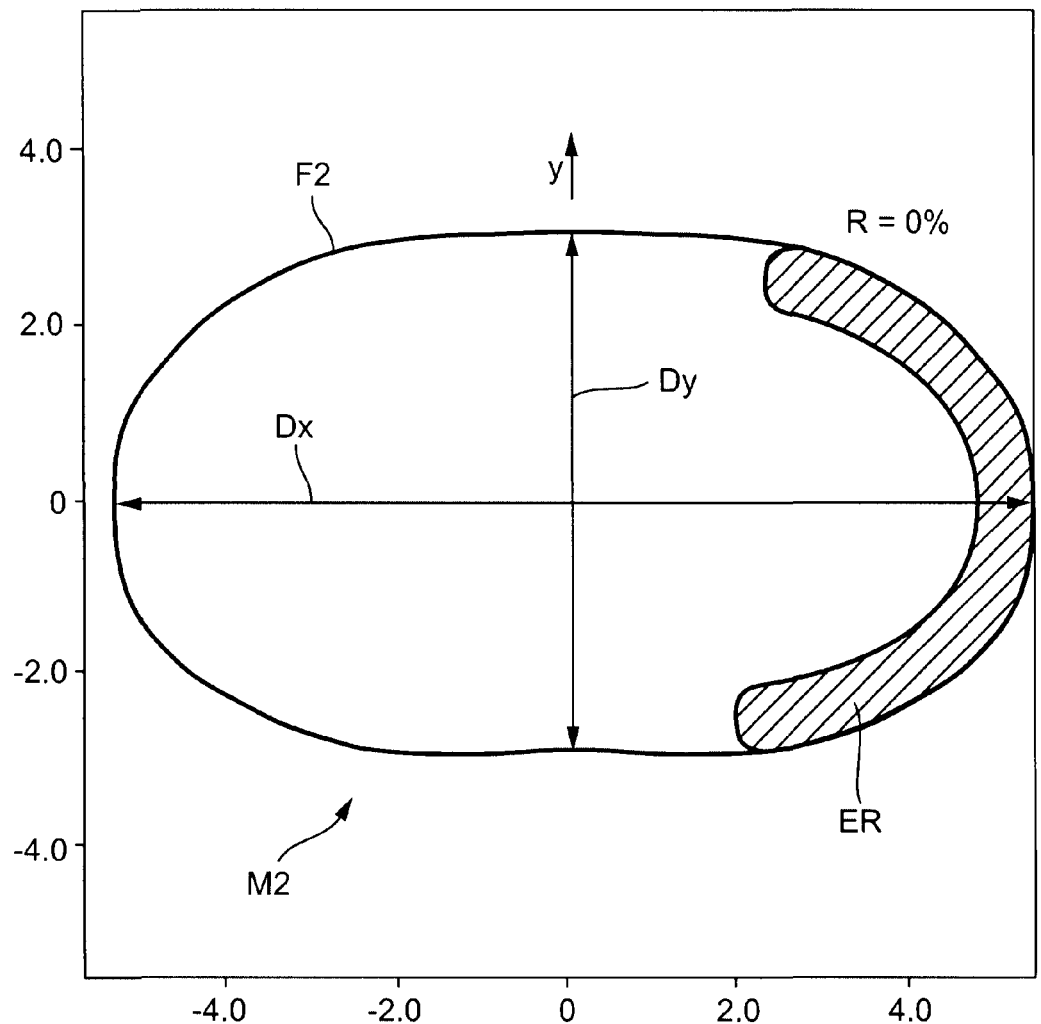
FIG. 12 shows schematically a footprint on second mirror M2 with an edge region ER with no reflection at the outer edge in the x direction.

FIG. 12 shows schematically a "footprint" on second mirror M2, where a relatively narrow edge region ER close to the right edge of the mirror (marked dark in the FIG. 12) has been identified as corresponding to field points critical with respect to pupil apodization. As used here, the term "footprint" denotes the region on a mirror which is actually used for reflecting the radiation beam. In general, the physical shape and size of the mirror may essentially correspond to the respective footprint such that all rays incident on a mirror are actually reflected from the mirror. The shape of the footprint may be described as a rectangular shape with rounded edges, where a diameter Dy of the footprint in the y-direction (scanning direction) is significantly smaller than the diameter Dx in the cross-scan direction (x-direction). In this exemplary embodiment, the aspect ratio Dy/Dx of the footprint is about 0.55. Considering that the cross section of the radiation beam is rectangular with a high aspect ratio exactly at the object surface or image surface, and essentially circular in the pupil surface, the footprint shape indicates that mirror M2 is optically between the closest field surface and the pupil surface.

Figure 13:
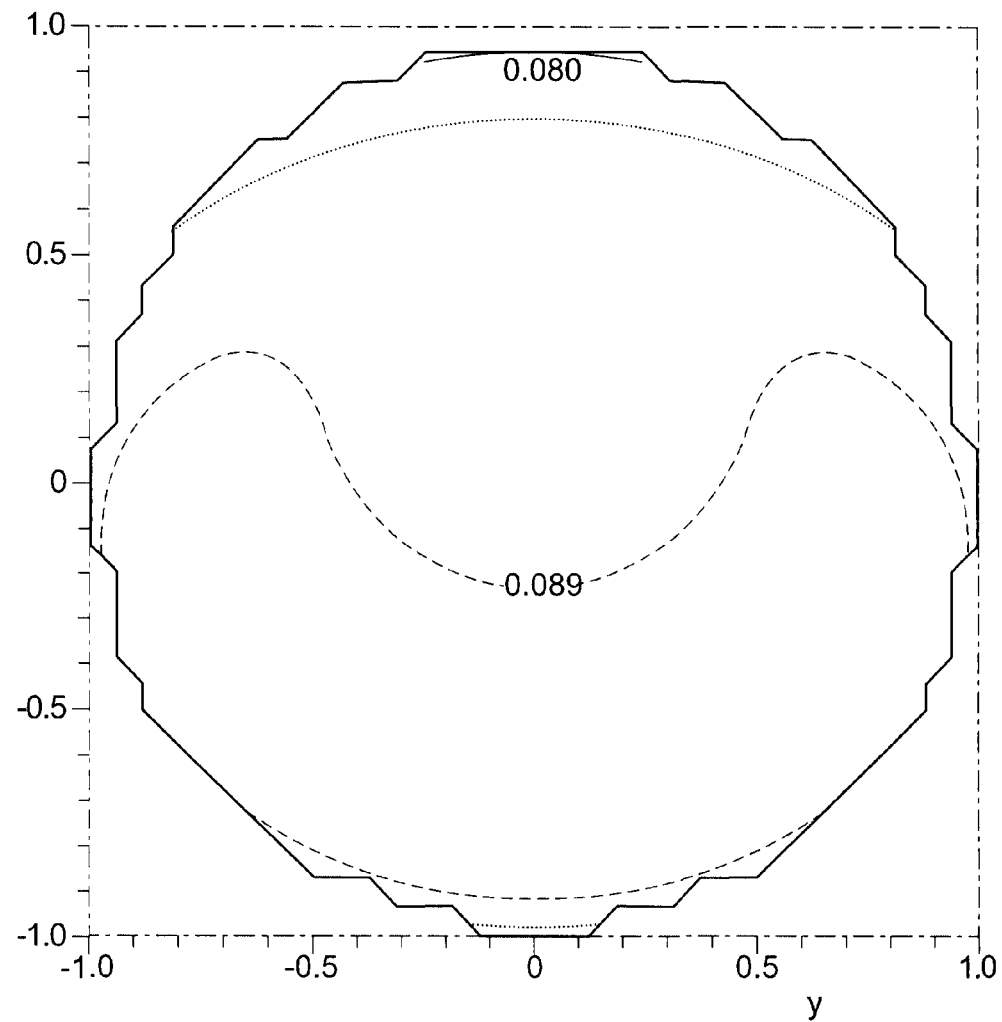
FIGS. 13 and 14 show spatial intensity distributions in the exit pupil for a center field point FP1 (FIG. 13) and an edge field Point FP2 (FIG. 14) when a reflective coating essentially according to FIG. 12 is used on second mirror M2.
Figure 13:
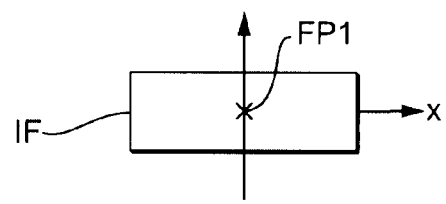
Figure 14:
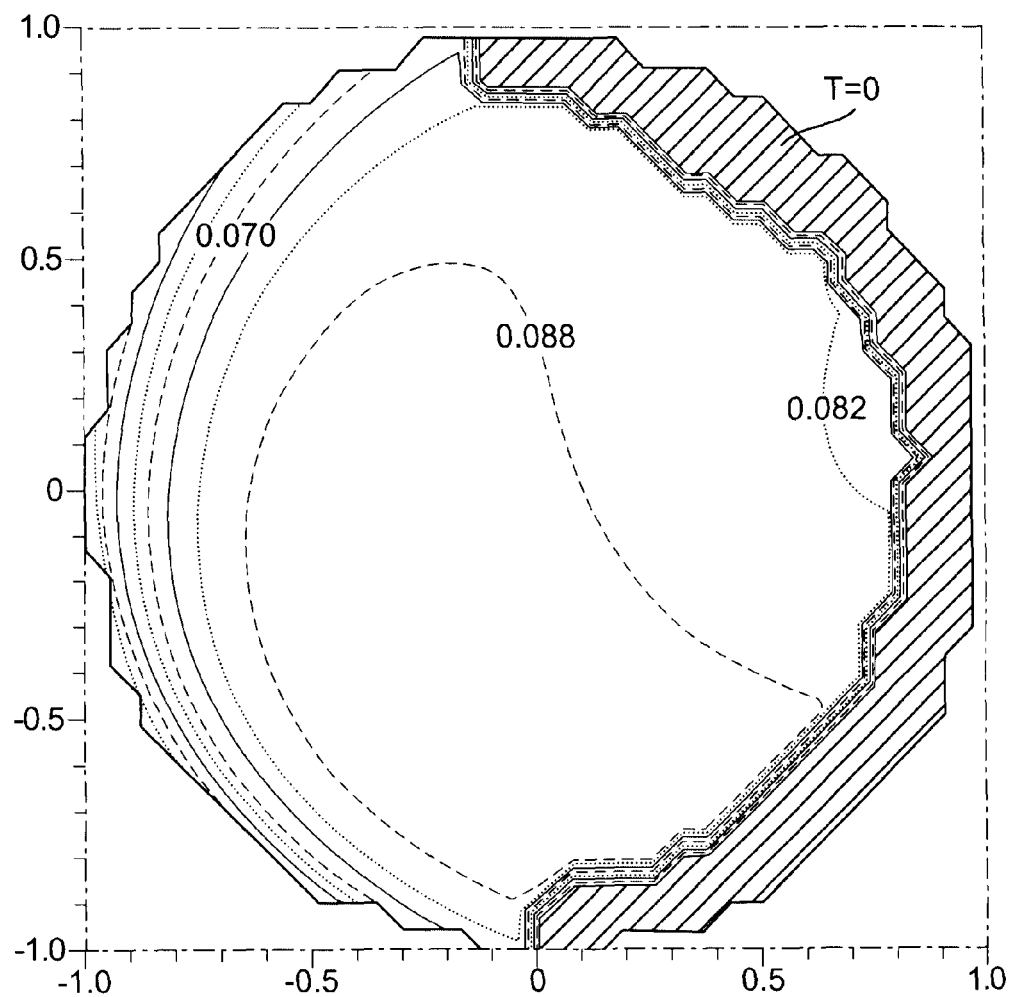

The local reflectance R of second mirror M2 in a narrow edge region ER close to the right edge (indicated dark in FIG. 12) is now reduced to R=0% (no reflection) for demonstration purposes to illustrate qualitatively how a modification of local reflectance may be used to influence the spatial intensity distribution in the exit pupil of the projection objective. FIGS. 13 and 14 show respective spatial intensity distribution in the exit pupil for the center field point FP1 (FIG. 13) and the edge field point FP2 (FIG. 14). It is evident from a comparison between FIGS. 13 and 6 that the mirror symmetry of the intensity distribution to the meridional plane re-mains unchanged. However, the total amount of intensity at different locations of the pupil is slightly reduced since the reflection losses at the right edge of the second mirror M2 influences the corresponding sub-apertures in the upper and lower part thereof. In contrast, the intensity distribution of the pupil corresponding to edge field point FP2 shown in FIG. 14 is significantly changed when compared to the distribution of FIG. 7. Specifically, the shape of the non-reflection edge region ER is reproduced in a C-shaped edge region with no transmission T=0 intensity level at the right edge of the pupil.

It can be seen from the effects explained the connection with FIGS. 12 to 14 that the variation of pupil apodization with locations in the image field may be effectively changed in a targeted manner if the reflectivity of a selected mirror (not too close to a pupil surface) is modified to influence the intensity distribution in the exit pupil of the projection objective.

An exemplary embodiment of a projection objective including an apodization correcting element formed by a mirror element with a targeted spatial distribution of reflectivity will now be explained in connection with FIGS. 15 to 17. The basic optical design is as described for the reference system in FIG. 3, the only structural difference is the layout of mirror M2, which is optimized to form or include an apodization correcting element.

Figure 15:
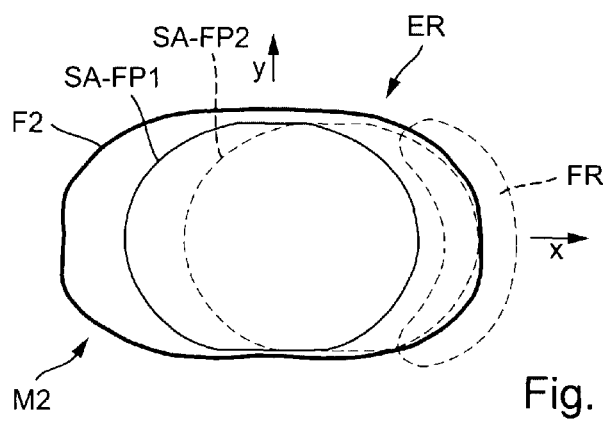
FIG. 15 shows schematically positions of a sub-aperture SA-FP1 corresponding to a central field point and a sub-aperture SA-FP2 of a sub-aperture corresponding to an edge field point on mirror M2.

FIG. 15 shows schematically positions of two selected sub-apertures SA-FP1 and SA-FP2 on the illuminated area of second mirror M2, where the area corresponds to the respective footprint F2. A sub-aperture on a mirror is an area on a mirror illuminated by a cone of light originating from a specific field point. Where an optical surface is placed exactly in a field surface, all corresponding sub-apertures are puncti-form and all sub-apertures of spatially separated field points are spatially separated from each other. On the other hand, where an optical surface is positioned in a pupil surface, the corresponding sub-apertures, which may be generally circular, may completely overlap. Where a mirror is positioned at a distance from a pupil surface, sub-apertures of the different field points spaced apart from each other in a field surface do not completely overlap. In the exemplary embodiment illustrated in FIG. 15, a first sub-aperture SA-FP1 corresponding to a central field point lies essentially centered on the mirror, whereas a second sub-aperture SA-FP2 corresponding to an edge-field point at the edge of the field in the x-direction (compare FIG. 7) is laterally offset to the first sub-aperture in the x-direction. Whereas the first sub-aperture SA-FP1 (solid line) does not extend into the edge region ER at the outer edge of the footprint F2 in the x-direction, the second sub-aperture SA-FP2 (bold dashed line) extends into the edge region ER.

The spatial separation of sub-apertures indicates that it is possible to manipulate the cones of radiation originating from the different field points separately and independently from each other, for example by changing the reflectivity of the mirror in the edge region ER, which may be accomplished by an appropriate intensity filter element. If an independent manipulation of the sub-apertures is desired, the filtering effect of the filter element should not extend into the intersection region covered by both footprints SA-FP1 and SA-FP2. Instead, the intensity manipulation by a filter element or the like should be located outside the first sub-aperture SA-SP1 corresponding to the central field point if a change of the intensity distribution corresponding to a central field point is not desired. An ex-ample of a filter region FR influencing the second sub-aperture SA-FP2 of the edge field point without influencing the first sub-aperture SA-FP1 of the central field point in the edge region ER is indicated with small dashed line in FIG. 15 (compare FIG. 12).

As explained in connection with FIGS. 6 and 7, only a relatively small amount of uneven pupil apodization is present for a central field point in the reference system (FIG. 6), whereas a highly asymmetric pupil apodization is found for the edge field point FP2. As a general trend, the asymmetry of apodization has been found to increase from the central field point FP1 towards the edge field point FP2 along the x-direction. From this analysis it is concluded that an improvement towards an increased symmetry of the intensity distribution in the exit pupil may be obtained by filtering the intensity corresponding to a filtering function with little or no filtering action close to or at the center of the filer element and an filtering efficiency which may be essentially zero in the region where the footprints SA-FP1 and SA-FP2 overlap and which may increase significantly towards the outer edge in the x-direction where the edge region ER is located.

Figure 16A:
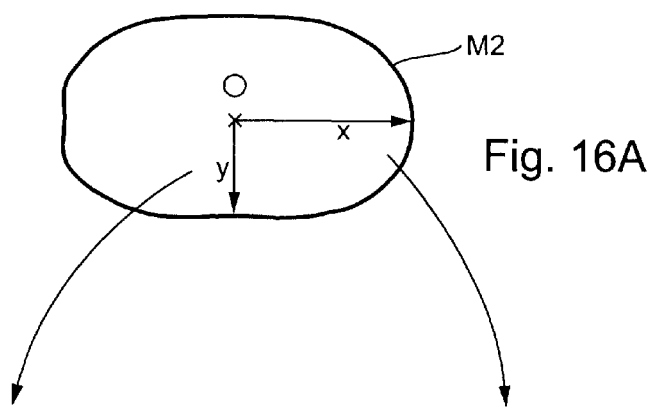
FIG. 16 shows schematically the variation of geometrical layer thickness of the cap layer in the y direction (FIG. 16B) and the x direction (FIG. 16C) on mirror M2 in FIG. 16A.
Figures 16B, 16C:
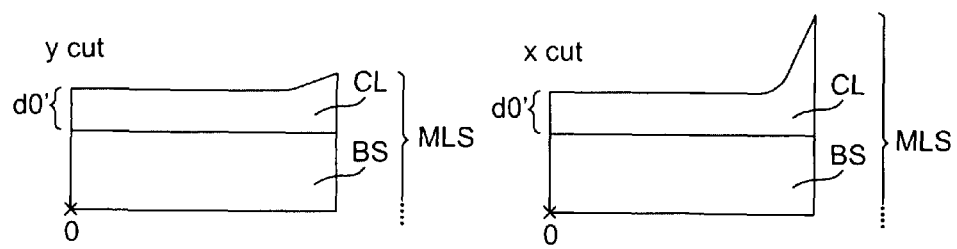

The schematic drawings in FIGS. 16A to 16C are used to further describe an exemplary embodiment of an apodization correcting element designed as an intensity filter which influences only the second sub-aperture SA-FP2 of the edge filed point without influencing the first sub-aperture SA-FP1 of the central field point. To this end, FIG. 16A shows the generally oval shape of second mirror M2, FIG. 16B shows a section (y-cut) through the mirror in a z-y plane (meridional plane) between the origin O of the mirror and the outer edge in y-direction, and FIG. 16C shows a section in x-direction (x-cut) from the origin to the outer edge in the x-direction, where the edge region ER shown in FIG. 15 is located.

As explained in connection with Table 3D, for example, the reflective coating on second mirror M2 includes a multilayer stack MLS having a bilayer stack BS formed by a multitude of bilayers, where each bilayer includes a relatively thick silicon layer and a relative thin molybdenum layer. The bilayer structure is formed on an anti stress layer interposed between the bilayer structure and the substrate (not shown in FIG. 16). A cap layer CL made of ruthenium is formed on the bilayer stack BS and forms the interface of the reflective coating towards the environment on the radiation entry side. The cap layer has a uniform thickness in the reference example of FIG. 3 discussed above. The cap layer forms a protective layer to protect the bilayer stack from contamination and the like. Further, the cap layer absorbs a specific amount of radiation energy depending on the geometrical thickness of the cap layer and the absorption coefficient k of the cap layer material. It is evident that a spatial variation of absorbing effect of the cap layer may be obtained if the geometrical thickness of the cap layer varies across the mirror surface.

In general, the geometrical layer thickness of the cap layer varies according to a non-rotationally symmetric grading function. The y-cut in FIG. 16B shows schematically the thickness variation in the first direction (y-direction) lying in the meridional plane, which may be described with a first grading function. FIG. 16C shows the variation of thickness in the second direction (x-direction, cross-scan-direction), which may be described by a second grading function. It is evident that the first grading function differs from the second grading function. The geometrical thickness increases from the origin O towards the edge of the mirror slightly in the first direction, whereas the amount of increase between the center and the edge region is significantly larger in the second direction such that a stronger absorbing effect is obtained in the edge region ER on the x-axis than in the direction perpendicular thereto. Both the first and second grading functions are continuous functions indicating a continuous distribution (without thickness steps) of geometrical layer thickness in the different radial direction from the origin. The layer thickness is generally uniform or has only a slight variation in a central zone around the origin O at least up to radial coordinates corresponding to the outer edge of the region corresponding to the first sub-aperture SA-FP1 corresponding to the central field point such that all the rays originating from the central field point "see" approximately the same geometrical layer thickness, whereby no significant variation of filtering action is obtained for the rays originating from the central field point. The central region having essentially uniform cap layer thickness may extend to more than 20% or more than 50% or more than 70% of the maximum radial distance to the origin in the respective direction. Outside the central region the layer thickness of the cap layer increases slightly in the y-direction and increases sharply in the x-direction corresponding to the edge region ER shown in FIG. 15. The schematics of FIGS. 16B and 16C are not to scale.

The cap layer CL has a spatial variation of geometrical thickness which is non-rotational symmetric to the origin O. It has been found useful to describe the geometrical layer thickness $g(x,y)$ of the cap layer using a non-rotationally symmetric polynomial in x and y according to:

$$g(x, y) = c1y*y + b_1 x^{10} + b_2 x^8 (y - y0)^2 + \\ b_3 x^6 (y - y0)^4 + b_4 x^4 (y - y0)^6 + b_5 x^2 (y - y0)^8 + b_6 (y - y0)^{10} \quad (5)$$

It can be seen that the polynomial does not have uneven powers in x-coordinates indicating that the function is mirror symmetric with respect to the meridional plane (corresponding to a y-z plane). In other words, the left half and the right half of the mirror with respect to the meridional plane MP are mirror symmetric to each other. Further, the polynomial does not have uneven powers in y-coordinate, which indicates that the desired intensity attenuation to be effected by the filtering action of the cap layer has a smooth variation towards the edge of the mirror with no inflection points. In the exemplary embodiment optimized to at least partly compensate the influence of the tilted coating on fifth mirror M5, the thickness profile of the cap layer of mirror M2 may be described with the following coefficients:

c1y=7.33e-3 y0=33.46
b1=2.316e-17 b2=3.976e-16
b3=-1.61e-15 b4=9.896e-15
b5=-5.029e-15 b6=3.209e-15

In this formulation, the function $g(x,y)$ describes the spatial variation of the layer thickness of the cap layer across the surface of the mirror, y0 describes a decentering of the layers relative to the origin O of the local coordinate system of the substrate and the coefficients c1y and b1-b6 correspond to the coefficients of the polynomial description of the lateral layer thickness variation, which may be used as free parameters to be optimized for a specific optical system.

The absolute value of the layer thickness of the cap layer CL at the origin O may be described in this exemplary embodiment, by d0'=d0*1.025, where d0=6.9 nm is the nominal thickness used in the exemplary embodiment described above for calculating the real physical thickness of the layers of the multilayer stack MLS. The thickness values of the multilayer stack MLS covered by the cap layer CL is the same as in the reference example described in FIG. 3.

The optical effect of the intensity filtering by the apodization correcting element formed by modified mirror M2 will now be explained in connection with FIGS. 17A, 17B and 17C. Similar to FIGS. 6 and 7 these figures demonstrate the apodization characteristics and present schematic plots of the spatial intensity distribution in the circular exit pupil of the projection objective. In this case, this intensity distribution is shown for three different image field points FP2, FP3 and FP4, each positioned at the outer edge of the rectangular image field in the x-direction. While FP2 lies in the middle of this edge on the x axis (FIG. 17A), FP3 lies at the upper corner at this edge (FIG. 17B) and FP4 lies at the lower corner at this edge (FIG. 17C).

It is evident that the intensity distribution in the pupil corresponding to of each of these edge field points exhibits only a relatively weak apodization when compared to the apodization without correction shown in FIG. 7. In general, the intensity value varies between a minimum value of about 0.085±0.001 in a large central region and less than 0.050 at the outer edge of the pupil.

Remarkably, the pupil apodization is significantly improved with respect to rotational symmetry when compared to the same projection objective without apodization correcting element.

Figure 17A:
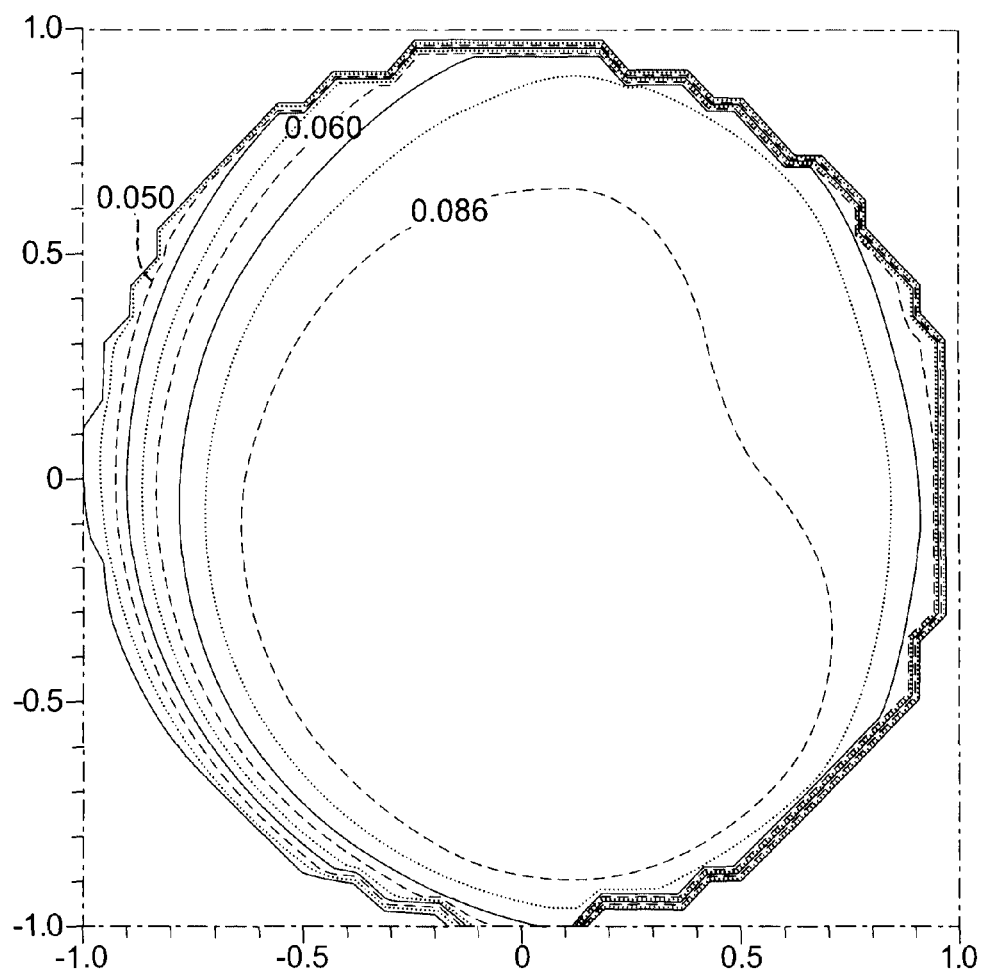
FIG. 17A, B, C show schematically the optical effect of intensity filtering by an apodization correcting element on the spatial distribution of intensity in the exit pupil for three different image field points FP2, FP3, FP4 positioned at the outer edge of the rectangular image field in the x direction.
Figure 17A:
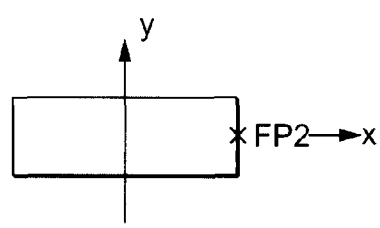
Figure 17B:
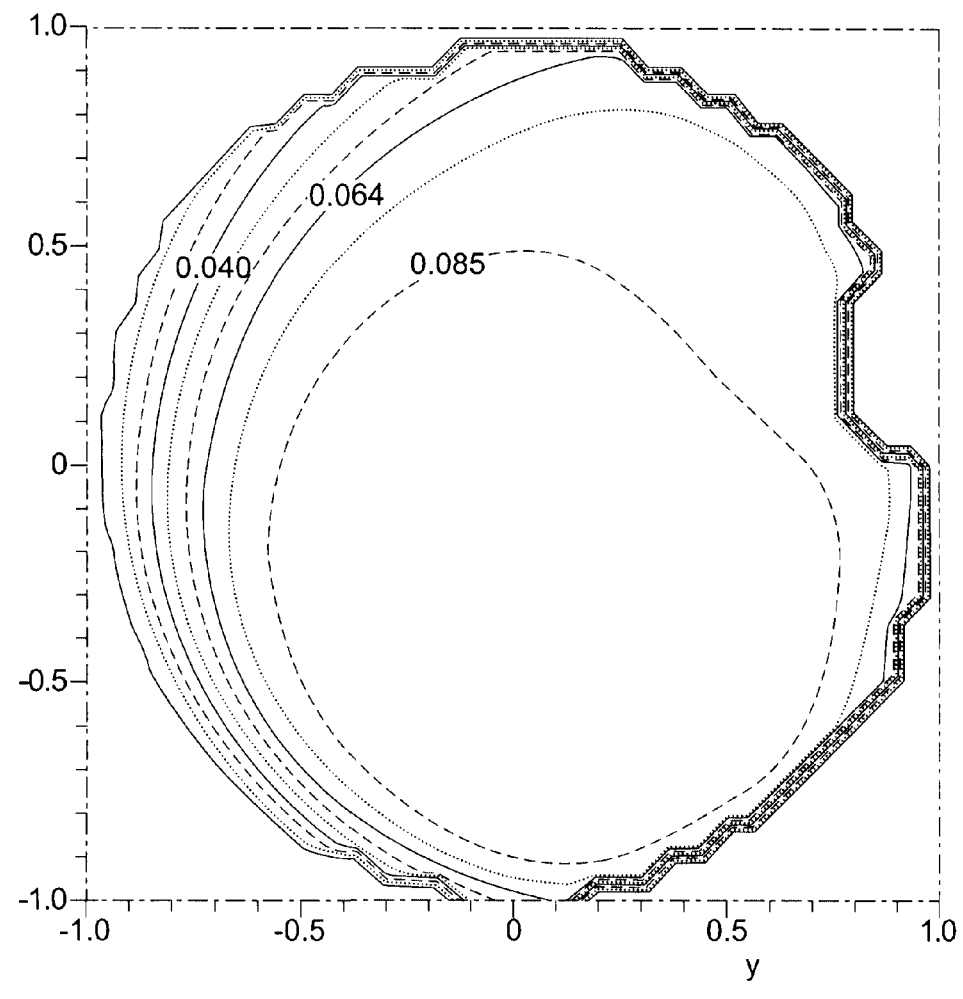
Figure 17B:
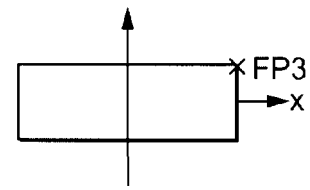
Figure 17C:
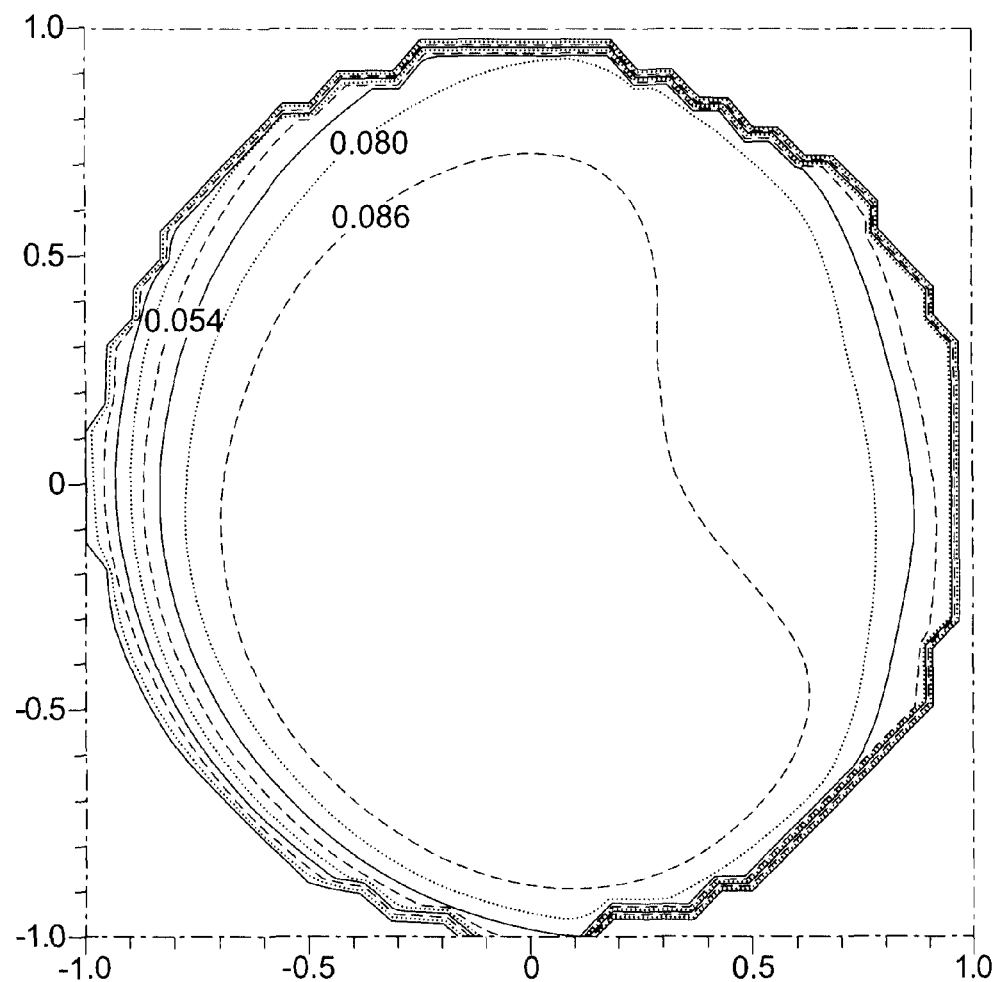
Figure 17C:
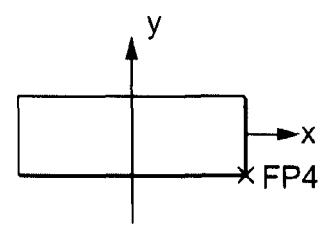

In order to demonstrate the improvement in rotational symmetry, the apodization parameter APO calculated for the edge field point FP2 in connection with FIG. 7 is now calculated for the system including an apodization correcting element (compare FIG. 17A). The apodization correction is effective such that there is virtually no change of the local intensity at the edge of the exit pupil at the left side where the smallest value for the intensity for all coordinates at the edge of the exit pupil occurs. The minimum intensity value $I_{MIN}=0.47$ is not changed significantly. However, the maximum value $I_{MAX}$ of intensity in the edge region of the exit pupil has been reduced in the region where the maximum was found in the distribution of FIG. 7 to a value $I_{MAX}=0.83$ in the lower right edge region of the exit pupil. The corresponding apodization parameter is APO=0.277, which is about 10% smaller than the apodization parameter for the reference system without apodization filter (APO=0.314). Therefore, the rotational symmetry particular at the outer edge of the exit pupil is significantly improved by the effect of the apodization correcting element.

A substantially rotational symmetric intensity distribution in the exit pupil allows to image structure features with different orientations with about the same contrast independent of the structure orientation, whereby H-V differences may be reduced when compared to the optical system without the apodization correcting element.

Further, the energy centroid of the intensity distribution in the pupil is shifted very close to the center of the pupil, thereby improving image-side telecentricity.

Embodiments of optical systems consisting of mirrors only (catoptric systems) may be designed for various wavelength ranges, for example for DUV wave-lengths at about 193 nm or less (operating e.g. with an ArF light source). Some embodiments are designed for EUV wavelength 2 nm<$\lambda$<20 nm and/or 10 nm<$\lambda$<15 nm and/or 13 nm<$\lambda$<14 nm Embodiments capable of use in a micro-lithographic projection exposure system are typically designed to provide high resolution such as resolutions less than 1 µm or less than 0.5 µm or less than 100 nm, for example.

The above description of the embodiments has been given by way of example. From the disclosure given, those skilled in the art will not only understand the present disclosure and its attendant advantages, but will also find apparent various changes and modifications to the structures and methods disclosed. It is sought, therefore, to cover all changes and modifications as fall within the spirit and scope of the disclosure, as defined by the appended claims, and equivalents thereof.

What is claimed is:

1. An optical system, comprising:
a plurality of elements arranged to image radiation at a wavelength $\lambda$ along a radiation path from an object field in an object surface to an image field in an image surface, wherein:
the plurality of optical elements comprises mirror elements including first and second mirror elements;
the first mirror element has a rotationally asymmetric reflective surface which deviates from a best-fit rotationally symmetric reflective surface by about $\lambda$ or more at one or more locations;
the second mirror element has a reflective surface comprising a reflective coating that is a non-rotationally symmetric, graded coating comprising a multilayer stack of different materials;
a layer in the multilayer stack has a geometrical layer thickness which varies according to a first grading function in a first direction and which varies according to a second grading function in a second direction perpendicular to the first direction, the second grading function being different from the first grading function.

2. The optical system according to claim 1, wherein:
the multilayer stack comprises a cap layer on a radiation entry side facing away from a substrate of the second mirror element; and
the cap layer has a geometrical layer thickness which varies according to a third grading function in a third direction and which varies according to a fourth grading function in a fourth direction perpendicular to the third direction, the fourth grading function being different from the third grading function.

3. The optical system according to claim 2, wherein the geometrical layer thickness of the cap layer increases from an origin towards an edge of the second mirror element with a first amount of increase in the third direction, and a second amount of increase between the origin and an edge region is significantly larger in the fourth direction.

4. The optical system according to claim 2, wherein the geometrical layer thickness of the cap layer is essentially uniform in a central zone around an origin at least up to radial coordinates corresponding to an outer edge of a region corresponding to a first sub-aperture corresponding to a central field point, and the geometrical layer thickness of the cap layer increases outside the central region slightly in the third direction and stronger in the fourth direction.

5. The optical system according to claim 2, wherein the cap layer comprises a material selected from a group consisting of ruthenium, aluminium oxide, silicon carbide, molybdenum carbide, carbon, titanium nitride, titanium dioxide, and a mixture, an alloy or a compound of ruthenium, aluminium oxide, titanium nitride and titanium dioxide.

6. The optical system according to claim 2, wherein the multilayer stack comprises a plurality of intermediate layers between the cap layer and the substrate, and each of the plurality of intermediate layers has a uniform layer thickness.

7. The optical system according to claim 2, wherein the multilayer stack comprises a plurality of intermediate layers arranged between the cap layer and the substrate, and the material of the cap layer has a specific absorbance for the radiation at wavelength $\lambda$ which is greater than a specific absorbance of each of the materials of the intermediate layers.

8. The optical system according to claim 2, wherein the material of the cap layer has a specific absorbance for the radiation at wavelength $\lambda$ which is greater than a specific absorbance of silicon and/or molybdenum.

9. The optical system according to claim 2, wherein the material of the cap layer has a specific absorbance characterized by an extinction coefficient k greater than 0.013 in a wavelength range between about 13 nm and 14 nm.

10. The optical system according to claim 2, further comprising a filter layer disposed on the cap layer on the radiation entry side, wherein the filter layer comprises a material configured to absorb radiation at the wavelength $\lambda$, and the filter layer has a geometrical thickness which varies spatially.

11. The optical system according to claim 10, wherein the filter layer comprises a material having a greater specific absorbance at wavelength $\lambda$ than the material of the cap layer.

12. The optical system according to claim 10, wherein the filter layer comprises a material having a smaller specific absorbance at wavelength $\lambda$ than the material of the cap layer.

13. The optical system according to claim 10, wherein the filter layer comprises a material selected from a group consisting of ruthenium, aluminium oxide, silicon carbide, molybdenum carbide, carbon, titanium nitride, titanium dioxide, and a mixture, an alloy or a compound of ruthenium, aluminium oxide, titanium nitride and titanium dioxide.

14. The optical system according to claim 1, wherein:
the multilayer stack comprises a stack of bilayers;
each bilayer comprises a layer of a first material having a first refractive index and a layer of a second material having a second refractive index which is lower than the first refractive index,
for each bilayer, the layer of the first material is thicker than the layer of the second material;
for each bilayer, a ratio between a geometrical thickness of the first layer and a geometrical thickness of the second layer varies according to third grading function in a third direction; and for each bilayer, the ratio varies according to a fourth grading function, different from the third grading function, in a fourth direction perpendicular to the third direction.

15. The optical system according to claim 1, wherein the second mirror element is positioned optically remote from a pupil surface of the optical system at a position where condition $P(M)<1$ is satisfied, and $$P(M)=D(SA)/(D(SA)+D(CR)),$$

where $D(SA)$ is a diameter of a sub-aperture of a ray bundle originating from a field point in the object surface on a respective surface M, and $D(CR)$ is a maximum distance of chief rays of an effective object field imaged by the optical system measured in a reference plane of the optical system on the surface M.

16. The optical system according to claim 15, wherein:
the reference plane is a symmetry plane of the optical system;
the condition $P(M)<0.99$ holds for a position of the second mirror element;
the second mirror element is positioned in an intermediate region optically between a pupil surface and a field surface of the optical system at a position where condition $0.99>P(M)>0.95$ is satisfied; and/or
the second mirror element is positioned optically near to a field surface where the condition $0<P(M)<0.93$ is satisfied.

17. The optical system according to claim 1, wherein the second mirror element is positioned at or optically close to a pupil surface of the optical system where the condition $0.98<P(M)<1$ is satisfied.

18. The optical system according to claim 1, wherein a third mirror element comprises a non-rotational symmetric coating which is a one-dimensionally graded coating comprising a multilayer stack of layers of different materials, the layers having a geometrical layer thickness which varies according to a third grading function in the first direction of the coating, and the layers having a geometrical layer thickness which is substantially constant in the second direction perpendicular to the first direction.

19. The optical system according to claim 18, wherein the third mirror is configured so that an average angle of incidence varies strongly according to a substantially linear function in the first direction, n and the average angle of incidence is substantially constant in the second direction perpendicular thereto.

20. The optical system according to claim 1, further comprising a third mirror having a reflective coating that is a non-rotationally symmetric, graded coating comprising a multilayer stack of different materials, wherein
a layer in the multilayer stack of the third mirror has a geometrical layer thickness which varies according to a third grading function in a third direction and which varies according to a fourth grading function in a fourth direction perpendicular to the third direction, the fourth grading function being different from the third grading function.

21. The optical system according to claim 1, wherein the second mirror element is configured to increase symmetry of a spatial intensity distribution present in an exit pupil of the optical system relative to symmetry of spatial intensity distribution that would be present in the exit pupil of the optical system in the absence of the second mirror element.

22. The optical system according to claim 1, wherein the second mirror element is effective to increase rotational symmetry of an intensity distribution present in an exit pupil of the optical system relative to rotational symmetry of spatial intensity distribution that would be present in the exit pupil of the optical system in the absence of the second mirror element.

23. The optical system according to claim 22, wherein the spatial intensity distribution present in the exit pupil of the optical system is characterized by an apodization parameter APO representing a normalized azimuthal variation of the intensity in an edge region of the exit pupil according to:

$$APO=(I_{MAX}-I_{MIN})/(I_{MAX}+I_{MIN}),$$

where $I_{MAX}$ is the maximum value of the intensity in an edge region of the exit pupil, and $I_{MIN}$ is the minimum value of the intensity in the edge region of the exit pupil, and
wherein the apodization parameter APO is decreased by at least 1% relative to the apodization parameter APO that would for the optical system in the absence of the second mirror element.

24. The optical system according to claim 1, wherein the second mirror element has a rotationally asymmetric reflective surface which deviates from a best-fit rotationally symmetric reflective surface by about $\lambda$ or more at one or more locations.

25. A projection-exposure system, comprising:
an illumination system; and
a projection objective,
wherein:
the illumination system is configured to receive radiation from a primary light source and to illuminate a pattern in an object surface of the projection objective;
the projection objective comprises the optical system according to claim 1; and
the projection-exposure system is a microlithography projection-exposure system.

26. A projection-exposure system according to claim 25, wherein the radiation is EUV radiation at a wavelength 13 nm$<\lambda<$14 nm.

27. A method, comprising:
using a projection-exposure system to fabricate semiconductor devices or other types of micro devices, wherein the projection-exposure system comprises:
an illumination system; and
a projection objective, and
wherein:
the illumination system is configured to receive radiation from a primary light source and to illuminate a pattern in an object surface of the projection objective; and
the projection objective comprises the optical system according to claim 1.

* * * * *